(12) United States Patent
Sakakura et al.

(10) Patent No.: US 7,301,279 B2
(45) Date of Patent: Nov. 27, 2007

(54) LIGHT-EMITTING APPARATUS AND METHOD OF MANUFACTURING THE SAME

(75) Inventors: Masayuki Sakakura, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 246 days.

(21) Appl. No.: 10/098,617

(22) Filed: Mar. 18, 2002

(65) Prior Publication Data

US 2002/0153831 A1   Oct. 24, 2002

(30) Foreign Application Priority Data

Mar. 19, 2001  (JP) .............................. 2001-079586
Mar. 26, 2001  (JP) .............................. 2001-087092

(51) Int. Cl.
    *H01L 51/52* (2006.01)
(52) U.S. Cl. .................... 313/509; 313/504; 257/40
(58) Field of Classification Search ............... 313/506, 313/507, 509, 498, 501, 502, 504; 428/917; 427/66; 315/169.3, 169.1; 257/40, 103, 257/350, 59, 72
    See application file for complete search history.

(56) References Cited

U.S. PATENT DOCUMENTS

| | | | |
|---|---|---|---|
| 5,550,066 A | 8/1996 | Tang et al. | |
| 5,853,905 A | 12/1998 | So et al. | |
| 5,929,561 A | 7/1999 | Kawami et al. | |
| 6,072,450 A * | 6/2000 | Yamada et al. ............... | 345/76 |
| 6,150,668 A | 11/2000 | Bao et al. | |
| 6,194,837 B1 | 2/2001 | Ozawa | |
| 6,222,314 B1 * | 4/2001 | Arai et al. .................... | 313/506 |
| 6,246,179 B1 | 6/2001 | Yamada | |
| 6,416,888 B1 * | 7/2002 | Kawamura et al. ........... | 428/690 |
| 6,492,778 B1 * | 12/2002 | Segawa ...................... | 315/169.3 |
| 6,509,574 B2 * | 1/2003 | Yuan et al. ................... | 250/551 |
| 6,541,918 B1 * | 4/2003 | Yudasaka .................... | 315/169.3 |
| 6,583,471 B1 * | 6/2003 | Yamazaki et al. ............ | 257/350 |
| 6,614,174 B1 * | 9/2003 | Urabe et al. .................. | 313/504 |
| 6,633,121 B2 * | 10/2003 | Eida et al. .................... | 313/504 |
| 6,636,001 B2 * | 10/2003 | Kawai et al. ................. | 315/169.3 |

(Continued)

FOREIGN PATENT DOCUMENTS

JP   11-031587   2/1999

(Continued)

OTHER PUBLICATIONS

Miyashita et al., "Full Color Displays Fabricated by Ink-Jet Printing," Asia Display / IDW '01, pp. 1399-1402.

*Primary Examiner*—Edward J. Glick
*Assistant Examiner*—Thomas R. Artman
(74) *Attorney, Agent, or Firm*—Fish & Richardson P.C.

(57) ABSTRACT

A light-emitting apparatus of the present invention includes: a first electrode formed on an insulating surface; a first insulating layer covering an end portion of the first electrode and having a tapered edge; a second insulating layer formed on the first electrode and the first insulating layer and formed of one kind or a plurality of kinds selected from the group consisting of silicon oxide, silicon nitride, and silicon oxynitride; an organic compound layer formed on the second insulating layer; and a second electrode formed on the organic compound layer.

68 Claims, 22 Drawing Sheets

U.S. PATENT DOCUMENTS

| | | | |
|---|---|---|---|
| 6,680,577 B1 * | 1/2004 | Inukai et al. | 315/169.3 |
| 6,793,962 B2 * | 9/2004 | Yano et al. | 427/66 |
| 6,858,271 B1 * | 2/2005 | Okada et al. | 428/1.4 |
| 6,903,377 B2 * | 6/2005 | Yamazaki et al. | 257/88 |
| 7,042,152 B2 * | 5/2006 | Tanaka | 313/506 |
| 2001/0041270 A1 | 11/2001 | Maruyama et al. | |
| 2002/0024493 A1 | 2/2002 | Ozawa et al. | |
| 2002/0110940 A1 | 8/2002 | Yamagata et al. | |
| 2002/0113248 A1 | 8/2002 | Yamagata et al. | |
| 2004/0178726 A1 | 9/2004 | Yamagata et al. | |

FOREIGN PATENT DOCUMENTS

| | | |
|---|---|---|
| JP | 11-224781 | 8/1999 |
| JP | 11224781 A | 8/1999 |
| JP | 2000-091626 | 3/2000 |

* cited by examiner

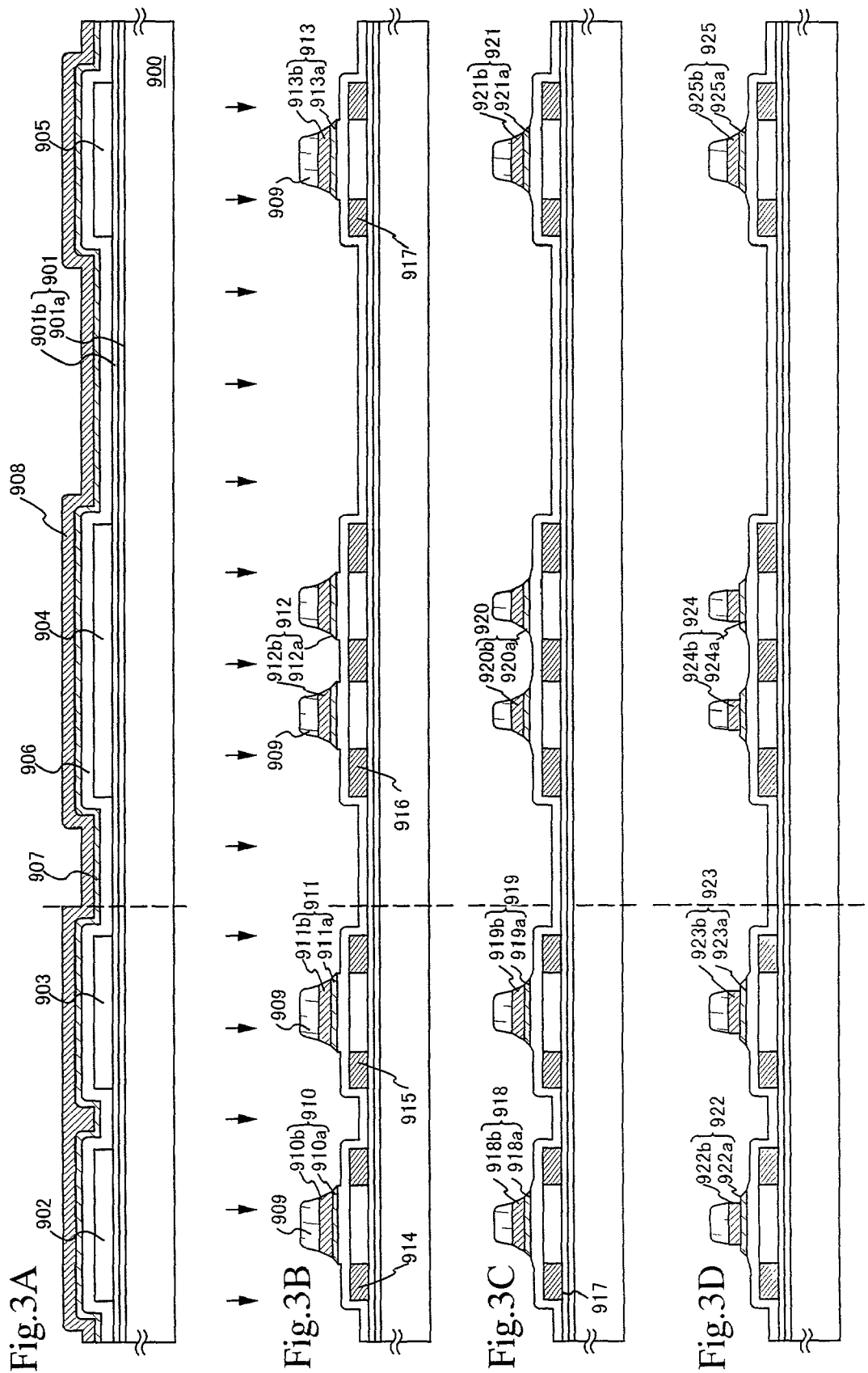

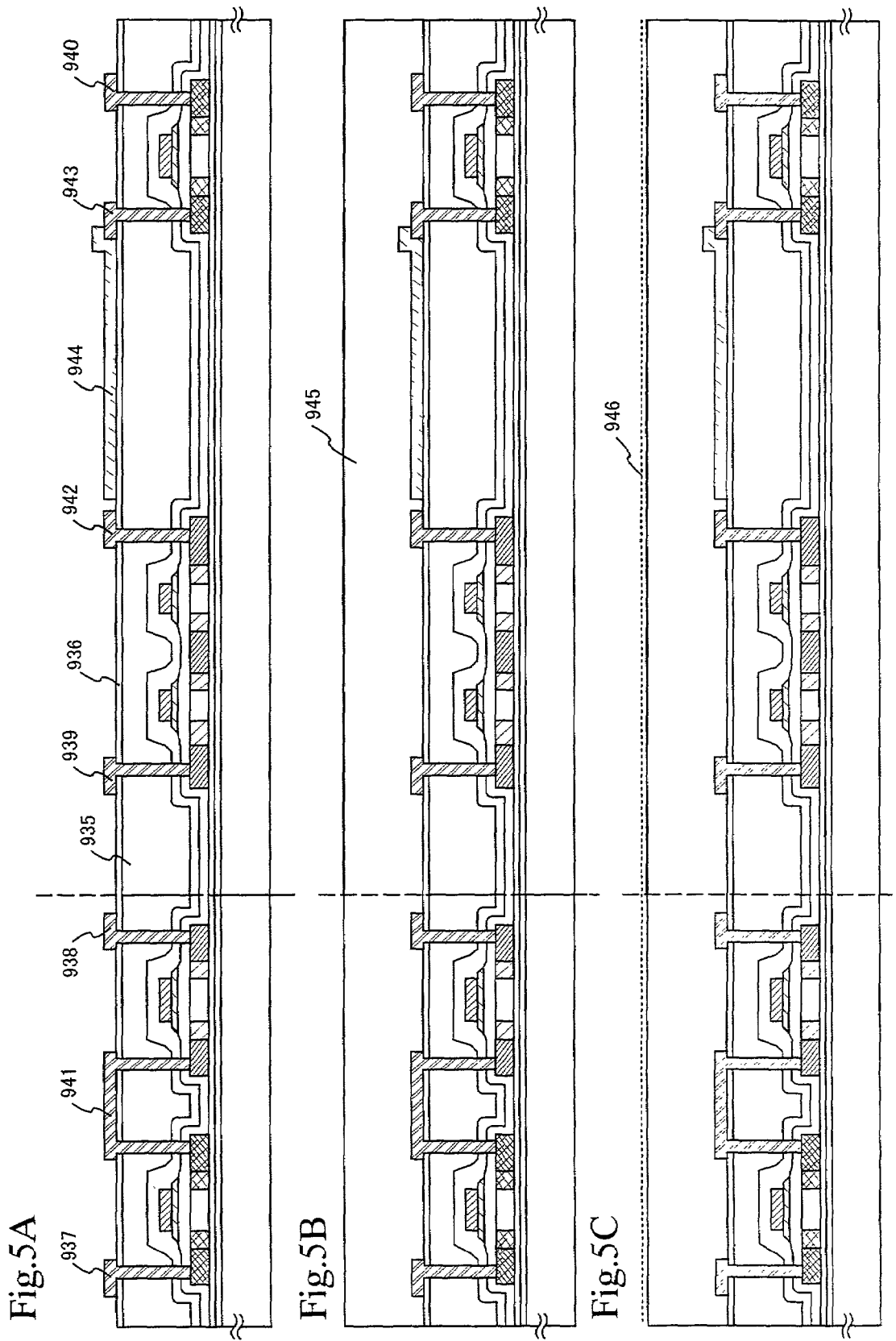

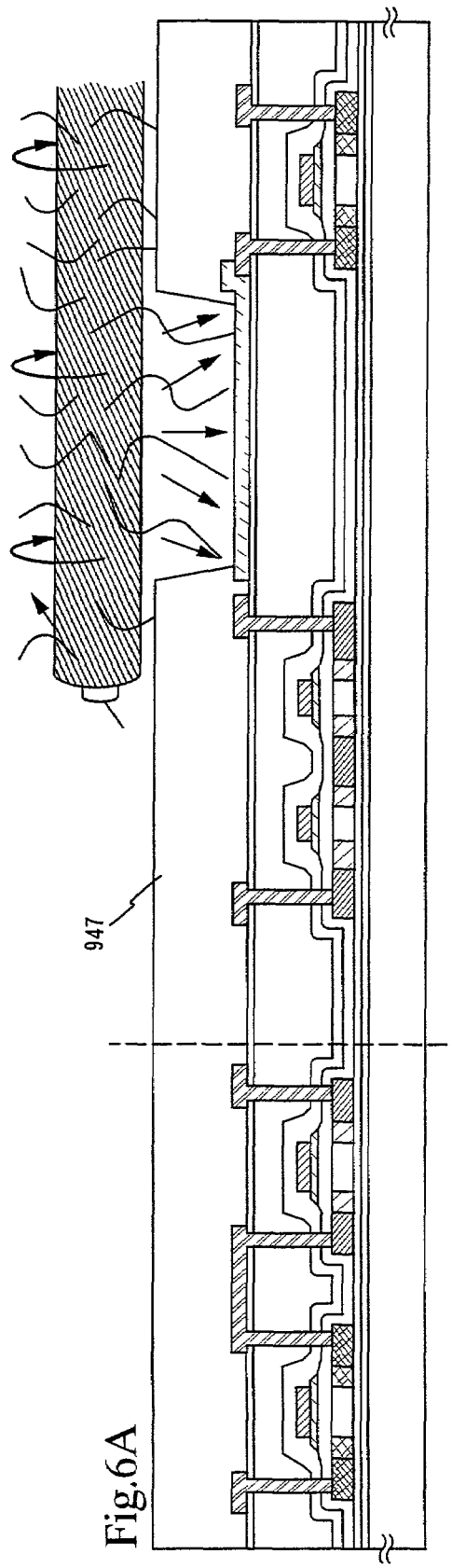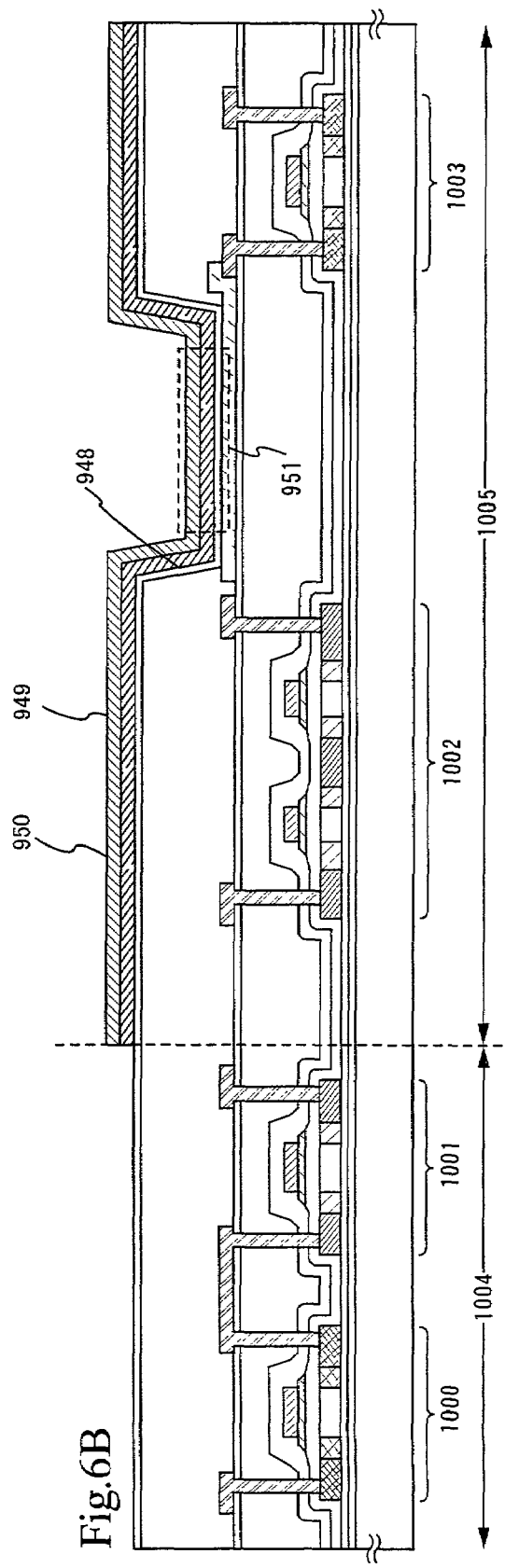

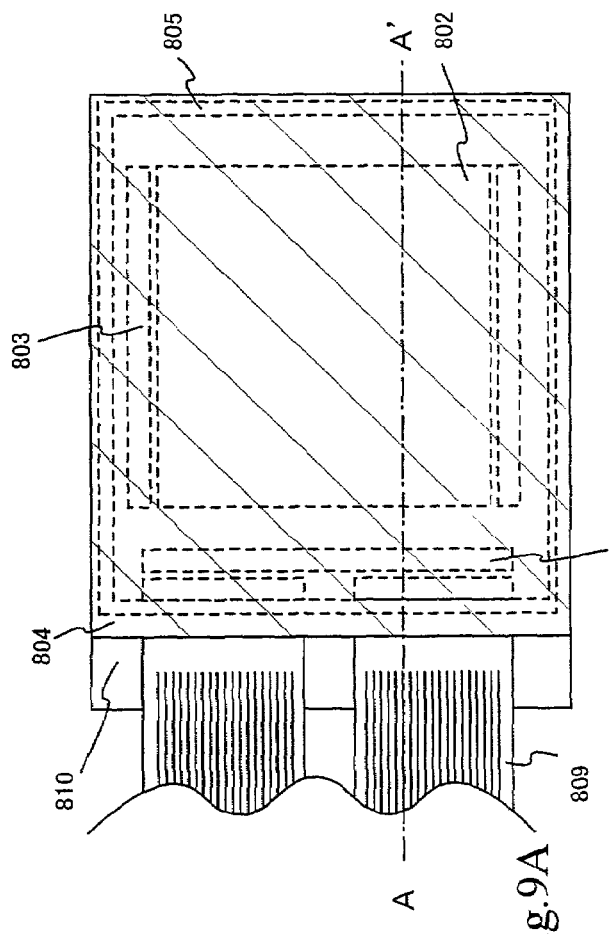
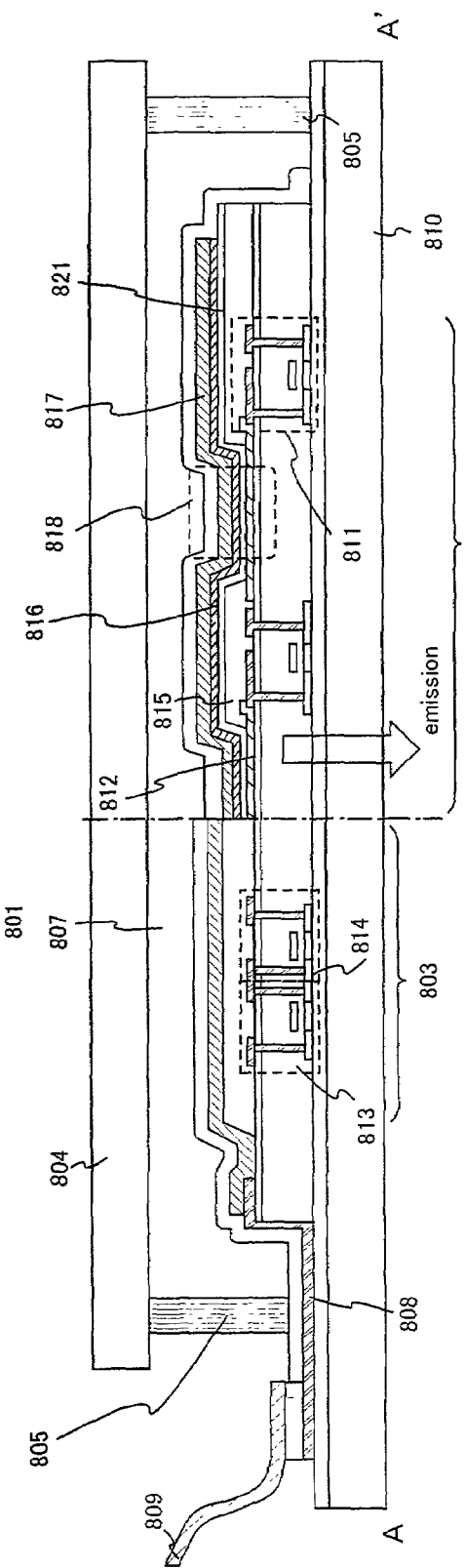
Fig.9A
Fig.9B

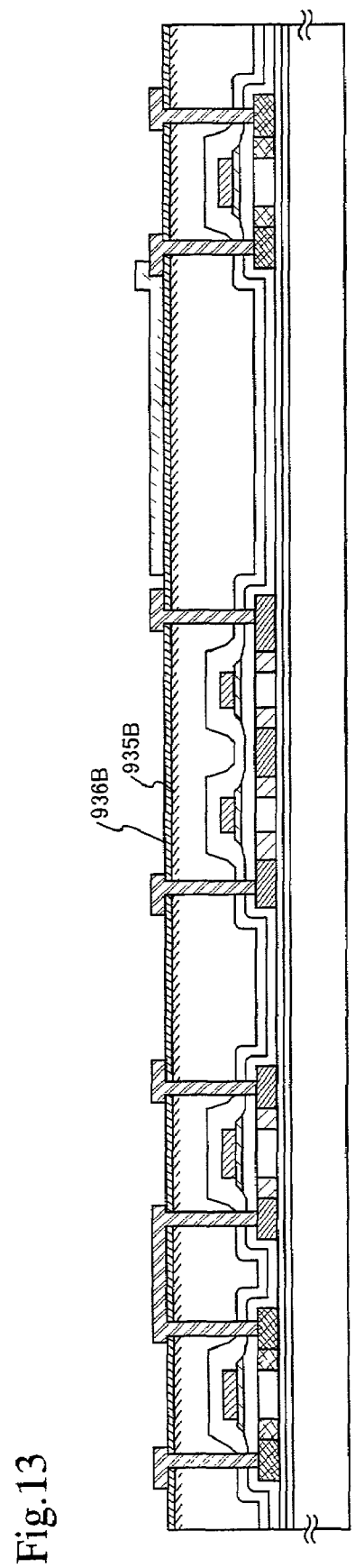

LIGHT-EMITTING APPARATUS AND METHOD OF MANUFACTURING THE SAME

BACKGROUND OF THE INVENTION

1. Field of the Invention

The present invention relates to a light-emitting device using a light-emitting element which has a film (hereinafter, referred to as an "organic compound layer") containing an organic compound that emits light through fluorescence and phosphorescence by applying an electric field, and a method of manufacturing the same.

2. Description of the Related Art

A light-emitting element using an organic compound as an illuminant has characteristics such as thinness and light-weight, high response, and driving at a D.C. current and a low voltage. Thus, such light-emitting element is expected to be applied to a next-generation flat panel display. In particular, a display device with light-emitting elements arranged in matrix is considered to have the advantages of a wide viewing angle and excellent visibility, compared with a conventional liquid crystal display device.

According to a light-emitting mechanism of a light-emitting element, by applying a voltage between first and second electrodes with an organic compound layer interposed therebetween, electrons injected from a second electrode and holes injected from a first electrode are recombined at a light-emission center of the organic compound layer to form molecular excitons, and the molecular excitons release energy in returning to a ground state to emit light. As excited states, singlet excitation and triplet excitation are known. It is considered that light can be emitted through either excited state.

Such A light-emitting device with light-emitting elements arranged in matrix can be driven by passive matrix driving (simple matrix type) or active matrix driving, and is capable of conducting a image display. In particular, in the case where the pixel density is increased, active matrix driving in which a switch is provided for each pixel (or one dot) is considered to be advantageous in that driving at a low voltage can be conducted.

An active matrix light-emitting device with a light-emitting element has an element structure as shown in FIG. 2. A thin film transistor (hereinafter, referred to as a "TFT") 202 is formed on a substrate 201, and an interlayer insulating film 203 is formed on the TFT 202. On the interlayer insulating film 203, a first electrode (anode) 205 electrically connected to the TFT 202 through a wiring 204 is formed. As a material for forming the first electrode 205, a transparent conductive material with a large work function is suitable, and indium tin oxide (ITO) is typically used.

An organic compound layer 206 is formed on the first electrode 205. In the following description, a layer provided between the first and second electrodes will be referred to as an organic compound layer for convenience. The organic compound layer 206 specifically includes a light-emitting layer, a hole injection layer, an electron injection layer, a hole transport layer, an electron transport layer, and the like. Basically, the light-emitting element has a structure in which a first electrode, a light-emitting layer, and a second electrode are stacked in this order. In addition, it may be possible to use a structure in which a first electrode, a hole injection layer, a light-emitting layer, and a second electrode are stacked in this order; a structure in which a first electrode, a hole injection layer, a light-emitting layer, an electron transport layer, and a second electrode are stacked in this order; or the like.

A second electrode 207 is formed after forming the organic compound layer 206, and thus a light-emitting element 209 is formed. As the second electrode 207, metal with a small work function (typically, metal belonging to Group 1 or 2 of the periodic table) is used in most cases.

Furthermore, a first insulating layer 208 of an organic resin material is formed so as to cover an end portion of the first electrode 205 for the purpose of preventing short-circuit between the second electrode 207 and the first electrode 205 at this end portion. In FIG. 2, although a light-emitting element formed in one pixel is shown, actually, a plurality of light-emitting elements are formed in a pixel portion, whereby an active matrix type light-emitting apparatus is formed.

The organic compound layer is formed to have a thickness of about 50 to 150 nm. When the surface of the first electrode (anode) positioned under the organic compound layer is not flat and has minute unevenness, the organic compound layer is not formed uniformly in thickness.

Furthermore, when the insulating surface under the first electrode is not flat and has foreign matters and unevenness with a thickness almost equal to or larger than that of the first electrode, the first electrode is not formed uniformly, and has a surface reflecting the unevenness. Because of this, the organic compound layer is not formed uniformly, either.

As a result, when the second electrode (cathode) is formed on the organic compound layer under the above-mentioned condition, a point (called a dark spot since it is observed as a black point) that does not emit light may be formed in one pixel. Furthermore, a short-circuit is caused vertically between the first and second electrodes.

The organic compound layer is likely to be degraded due to oxygen and moisture. If an organic resin material such as polyimide, polyamide, and acrylic resin is used for the interlayer insulating film and moisture and oxygen occluded in the film are released, a light-emitting element may be degraded due to the gas.

On the other hand, in terms of a TFT, an alkali metal or alkaline-earth metal material, such as Li and Mg, which is a bad impurity of a movable ion with respect to a semiconductor, is used as a material for the second electrode of the light-emitting element. Therefore, in an active matrix type light-emitting device, it is required to prevent the second electrode material from diffusing to a TFT side.

SUMMARY OF THE INVENTION

Therefore, the present invention has been made with the foregoing in mind, and it is an object of the present invention to provide a light-emitting device composed of a light-emitting element using an organic compound with a prolonged life and enhanced reliability, and a method of manufacturing the same.

In order to solve the above-mentioned problem, the present invention relates to a light-emitting device which has an insulating layer provided between an organic compound layer and an electrode positioned below the organic compound layer, and the insulating layer allows a tunnel current or a Fowler-Nordheim current to flow therethrough to supply a current to the organic compound layer, and prevents moisture from diffusing to the organic compound layer. Such kind of insulating layer is formed of one kind or a plurality of kinds in combination selected from the group consisting of silicon oxide, silicon nitride, and silicon oxynitride, and has a thickness of 1 to 10 nm, and preferably a thickness of 2 to 3 nm.

The light-emitting device of the present invention includes: a first electrode formed on an insulating surface; a first insulating layer having an opening on the first electrode, covering an end portion of the first electrode, and having a tapered edge; a second insulating layer formed on the first electrode and the first insulating layer and formed of one kind or a plurality of kinds selected from the group consisting of silicon oxide, silicon nitride, and silicon oxynitride; an organic compound layer formed on the second insulating layer; and a second electrode formed on the organic compound layer.

In addition to the above structure, the light-emitting device of the present invention includes: a TFT having a source region and a drain region; a interlayer insulating film over the source region and the drain region; a drain electrode connected to the drain region through an opening formed in the interlayer insulating film; a first electrode formed on the interlayer insulating film so as to be connected to the drain electrode; a first insulating layer having an opening on the first electrode, covering an end portion of the first electrode and having a tapered edge; a second insulating layer formed on the first electrode and the first insulating layer and made of one kind or a plurality of kinds selected from the group consisting of silicon oxide, silicon nitride, and silicon oxynitride; an organic compound layer formed on the second insulating layer; and a second electrode formed on the organic compound layer. The second insulating layer may be formed of a material containing carbon as its main component. Typically, diamond-like carbon (DLC) can be used.

The following structure is provided: a first electrode and an organic compound layer form a tunnel junction; a second insulating layer is formed to have a thickness that allows the first electrode and the organic compound layer to form a tunnel junction; or the second insulating layer is formed to have a thickness that allows a tunnel current to flow therethrough. More specifically, by forming the second insulating layer to have a thickness of 1 to 10 nm, preferably 2 to 3 nm, a tunnel current is allowed to flow between the first electrode and the organic compound layer. By providing the second insulating layer, minute unevenness on the surface of the first electrode (anode) is flattened, and the organic compound layer can be formed uniformly. Even if unevenness and foreign matters with several tens of to several hundreds of nm are present on the first interlayer insulating film or the second interlayer insulating film, a dark spot and a defect (non-lighting of a light-emitting element due to a short-circuit between the first and second electrodes) can be prevented by forming the second insulating layer.

The insulating surface or the interlayer insulating film is formed of polyimide, acrylic resin, silicon nitride, or silicon oxynitride.

By using an inorganic material such as silicon oxide, silicon nitride, and silicon oxynitride for the second insulating layer, oxygen and moisture contained in the interlayer insulating film formed of an organic resin can be prevented from entering the organic compound layer, thereby avoiding degradation of the organic compound layer. Furthermore, the second insulating layer using the above-mentioned inorganic material can prevent an alkali metal or alkaline-earth metal material that degrades the characteristics of a TFT, such as Li and Mg contained in the second electrode of the light-emitting element, from entering an active layer of the TFT.

In order to solve the above-mentioned problem, the present invention relates to a method of manufacturing a light-emitting device, including the steps of: forming a first electrode on an insulating surface; forming a first insulating layer that covers an end portion of the first electrode and has a tapered edge; forming a second insulating layer formed of one kind or a plurality of kinds selected from silicon oxide, silicon nitride, and silicon oxynitride on the first electrode and the first insulating layer; forming an organic compound layer on the second insulating layer; and forming a second electrode on the organic compound layer.

Another method includes the steps of: forming an interlayer insulating film over a source region and a drain region of a TFT; forming an opening to reach the drain region in the interlayer insulating film; forming a drain electrode; forming a first electrode connected to the drain electrode on the interlayer insulating film; forming an insulating layer that covers the first electrode connected to the drain electrode; forming an opening in the insulating layer on the first electrode to provide a first insulating layer; forming a second insulating layer made of one kind or a plurality of kinds selected from the group consisting of silicon oxide, silicon nitride, and silicon oxynitride on the first electrode and the first insulating layer; and forming a second electrode on the organic compound layer.

The second insulating layer may be formed of a material mainly containing carbon. Typically, DLC can be used. The second insulating layer is formed to have a thickness of 1 to 10 nm, preferably 2 to 3 nm. In order to uniformly form a coating film with such a small thickness over the first electrode to the first insulating layer, plasma chemical vapor deposition (CVD) or sputtering is desirably conducted.

In the present invention, a light-emitting element refers to an element in which an organic compound layer is provided between a pair of electrodes, and a light-emitting device refers to an image display device or a light-emitting device using a light-emitting element. The light-emitting device also includes a module in which a connector (e.g., a flexible printed circuit (FPC), a tape automated bonding (TAB) tape, or a tape carrier package (TCP)) is attached to a light-emitting element; a module in which a printed wiring board is provided at the end of the TAB tape or the TCP; and a module in which an integrated circuit (IC) is directly mounted on a light-emitting element by a chip-on-glass (COG) method. The light-emitting element emits light in a singlet excited state or a triplet excited state, or in both the states.

These and other advantages of the present invention will become apparent to those skilled in the art upon reading and understanding the following detailed description with reference to the accompanying drawings.

BRIEF DESCRIPTION OF THE DRAWINGS

In the accompanying drawings:

FIGS. 3A to 3D show the processes of manufacturing a light-emitting apparatus;

FIGS. 5A to 5C show the processes of manufacturing a light-emitting apparatus;

FIGS. 6A and 6B show the processes of manufacturing a light-emitting apparatus;

FIGS. 9A and 9B show a sealing structure of a light-emitting apparatus;

FIG. 13 shows an embodiment mode of the processes of manufacturing a light-emitting apparatus;

DESCRIPTION OF THE PREFERRED EMBODIMENTS

Hereinafter, a method of manufacturing a pixel portion of a light-emitting device and a structure thereof will be described as an embodiment mode of the present invention with reference to FIGS. 1A to 1B.

Figure 1A:
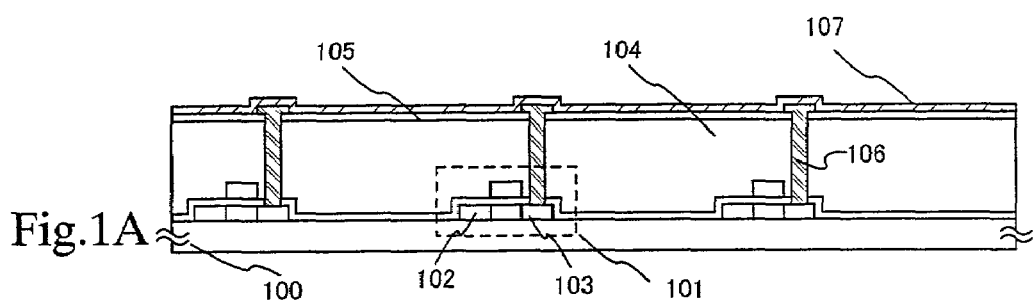
FIGS. 1A to 1E show a method of manufacturing a light-emitting apparatus in accordance with an embodiment mode of the present invention.

In FIG. 1A, a TFT 101 are formed on a substrate 100. The TFT 101 shown herein control a current flowing through a light-emitting element, and will be referred to as a current control TFT 101. In a semiconductor film of the TFT 101, a source region 102 and a drain region 103 to which an impurity with one conductivity is added are formed.

An interlayer insulating film 104 is formed on the current control TFTs 101. The interlayer insulating film 104 is formed of an organic resin material such as polyimide, acrylic resin, and polyimideamide. Each of these materials is applied with a spinner, and sintered or polymerized by heating to form the interlayer insulating film 104 with a flat surface. An organic resin material generally has a low dielectric constant and a parasitic capacitance can be reduced.

Then, a second interlayer insulating film 105 is formed on the first interlayer insulating film 104 so that the gas released from the interlayer insulating film 104 does not adversely affect a light-emitting element. The second interlayer insulating film 105 may be formed of an inorganic insulating film (typically, a silicon oxide film, a silicon oxynitride film, a silicon nitride film, or a stacked layer combining these films). The second interlayer insulating film 105 is formed by using plasma CVD and discharging with a power density of 0.1 to 1.0 W/cm$^2$ at a high frequency (13.56 MHZ) under a reaction pressure of 20 to 200 Pa and a substrate temperature of 300° C. to 400° C. Alternatively, the following may also be possible: the surface of the interlayer insulating film 104 is subjected to a plasma treatment, and a cured film containing one kind or a plurality of kinds of gas elements, which are selected from the group consisting of hydrogen, nitrogen, halocarbon, hydrogen fluoride and noble gas, is formed.

Thereafter, a resist mask with a desired pattern is formed. Contact hole reaching drain regions of the current control TFTs 101 are formed, and a wiring 106 is formed. As a material for the wiring 106, conductive metal such as Al, Ti, and an alloy material thereof is used, such a material is formed into a film by sputtering or vapor deposition and thereafter, the film is patterned to a desired shape.

Then, for first electrodes 107 of the light-emitting element, a transparent conductive film in which 2 to 20% zinc oxide (ZnO) is mixed with ITO or indium oxide is formed.

As described later, in the case where a second insulating layer is formed of one kind or a plurality of kinds selected from the group consisting of silicon oxide, silicon nitride, and silicon oxynitride, ITO is used for the first electrode. Furthermore, in the case where the second insulating layer is formed of DLC, the second insulating layer can be formed with good adhesion by using ZnO or a compound of ZnO and ITO.

Figure 1B:
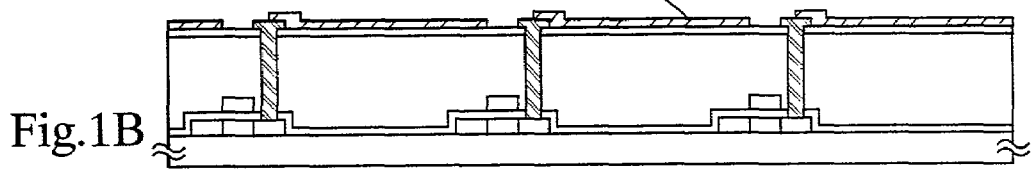
Figure 1C:
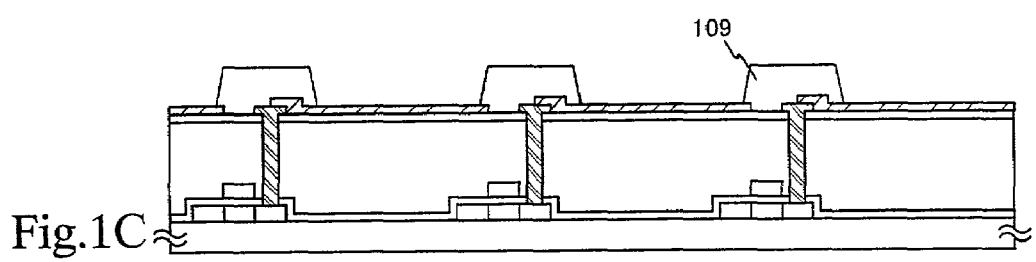
Figure 1D:
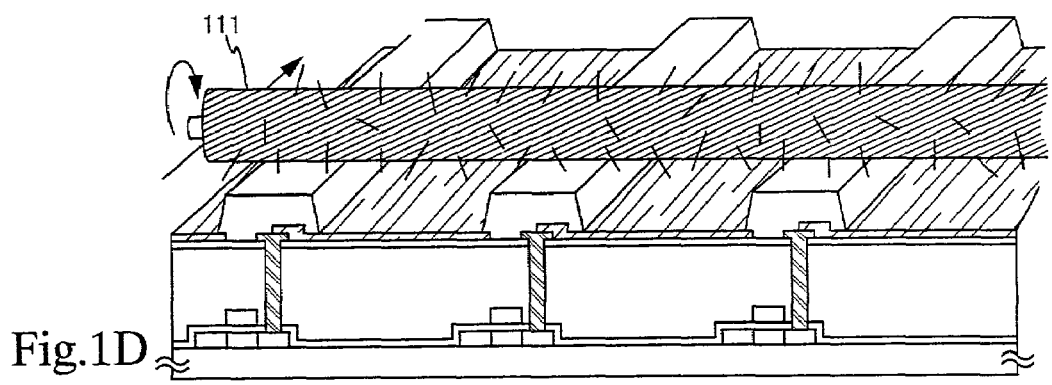
Figure 1E:
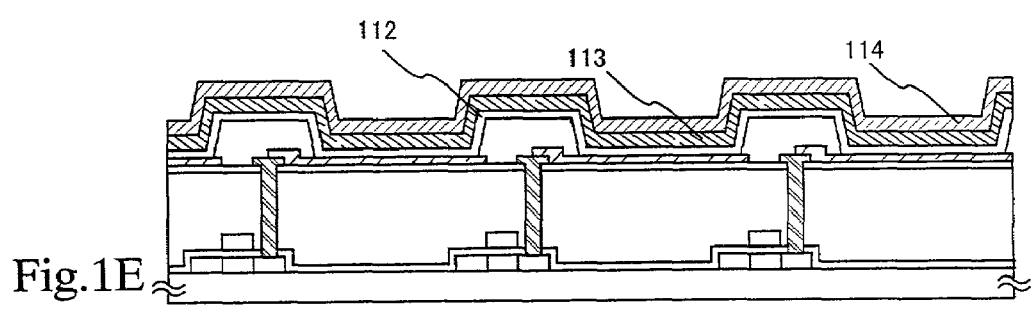
Figure 2:
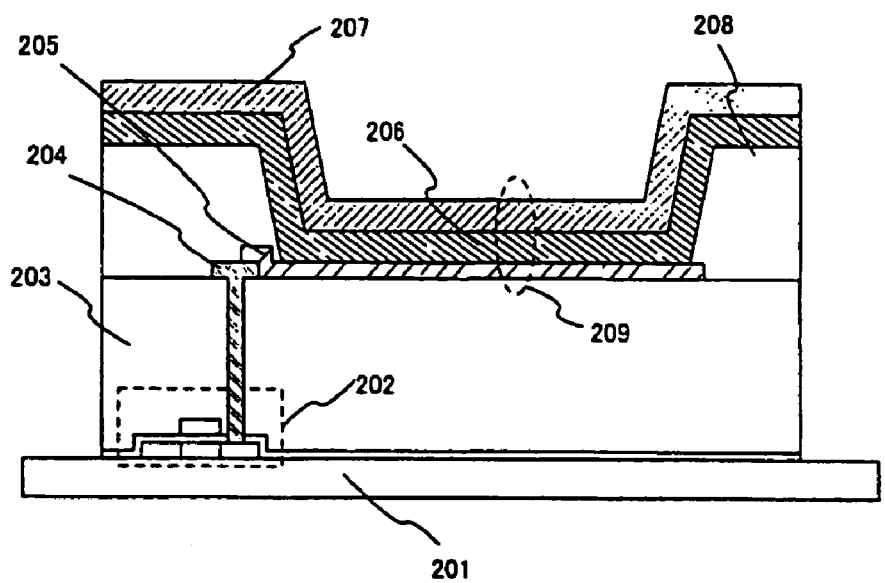
FIG. 2 shows an example of a conventional light-emitting apparatus.

Then, as shown in FIG. 1B, the transparent conductive film is etched to form the first electrodes 108. Thereafter, an organic resin film of a material selected from the group consisting of polyimide, acrylic resin, and polyimideamide is formed over the entire surface. In this case, a thermosetting material that is cured by heating or a photosensitive material that is cured by irradiation with UV-light can be adopted. In the case of using a thermosetting material, a resist mask is formed after the thermosetting material is cured, followed by dry etching, whereby a first insulating layer 109 with openings on the first electrodes 108 is formed. In the case of using the photosensitive material, the first insulating layer 109 with openings on the first electrodes 108 is formed by exposure and development using a photomask. In any case, the first insulating layer 109 is formed so as to have openings on the first electrodes 108, cover the end portions of the first electrodes 108, and have tapered edges. By forming the edges of the first insulating layer 109 in a taper shape, coverage of a second insulating layer and an organic compound layer to be formed later can be made satisfactory.

Then, the surfaces of the first electrodes are wiped with a detergent and a polyvinyl alcohol (PVA) type porous material 111, whereby the surfaces of the first electrodes 108 are flattened and dust and the like are removed therefrom. A treatment of wiping the surfaces of the first electrodes 108 with a PVA type porous material or the like, thereby flattening the surfaces and removing dust therefrom is referred to as "cleaning by wiping".

Thereafter, moisture contained in the first insulating layer 109 is released by heating at 200° C. to 300° C., preferably 250° C. Because of this, a change in volume and dehydration of the first insulating layer 109 can be prevented after the light-emitting element is completed. Thus, a light-emitting device can be provided in which initial degradation thereof does not occur and stability is ensured for a long period of time.

After the surfaces of the first electrodes 108 are wiped, a second insulating layer 112 is formed. The second insulating layer 112 is formed of one kind or a plurality of kinds selected from the group consisting of silicon oxide, silicon nitride and silicon oxynitride, or an insulating material mainly containing carbon. It is preferable to use a silicon oxynitride film formed by plasma CVD method using a mixed gas of $SiH_4$ and $N_2O$. The ratio between oxygen (O) and nitrogen (N) contained in the silicon oxynitride film is set to be (O/(N+O))=0.8 to 1.2. By setting the composition ratio as such, transparency of light with a short wavelength is enhanced, and a blocking property of alkali metal and alkaline earth metal is enhanced.

The effect of the second insulating layer 112 can be obtained similarly by using an insulating film mainly containing carbon. A typical example thereof includes DLC.

The second insulating layer 112 is interposed between the first insulating film 108 and the organic compound layer 113 to be formed later. Therefore, the thickness of the second insulating layer 112 is set so that a tunnel current or a Fowler-Nordheim current flows therethrough. Therefore, the thickness of the second insulating layer 112 is set to be 1 to 10 nm, preferably 2 to 3 nm.

An organic compound layer 113 is formed by stacking a combination of a plurality of layers such as a hole injection layer, a hole transport layer, a hole blocking layer, an electron transport layer, an electron injection layer, and a buffer layer in addition to a light-emitting layer. The organic compound layer 113 is formed to have a thickness of about 10 to 150 nm.

A second electrode 114 is formed by vapor deposition after depositing the organic compound layer 113. As a material for the second electrode 114, not only an MgAg alloy and an AlLi alloy, but also a film formed by co-deposition of an element belonging to Group 1 or 2 of the periodic table with aluminum can be used. The thickness of the second electrode 114 is preferably about 80 to 200 nm.

As described above, a tunnel junction is formed to a thickness of about 1 to 10 nm (preferably about 2 to 3 nm) on the first electrodes 108 to provide a second insulating layer that allows a tunnel current or a Fowler-Nordheim current to flow therethrough, whereby minute unevenness on the surface of the first electrodes 108 (anodes) can be flattened, and the organic compound layer can be formed uniformly. Even if unevenness and foreign matters with several tens of to several hundreds of nm are present on the first interlayer insulating film 104 or the second interlayer insulating film 105, a dark spot and a defect (non-lighting of a light-emitting element due to a short-circuit between the first and second electrodes) can be prevented by forming the second insulating layer 112.

By providing the second insulating layer 112, degassing from the first insulating layer 109 formed of an organic resin material such as polyimide, polyamide, and acrylic resin can be prevented, and the organic compound layer 113 can be prevented from being degraded. Furthermore, Li and Mg which are elements constituting the second electrode 114 can be prevented from diffusing toward the current control TFTs 101 side. Because of two effects described here, the life of the light-emitting apparatus can be prolonged, and reliability thereof can be enhanced.

Embodiment 1

In this embodiment, the light-emitting element formed by using the present invention is explained. Described next is an example of a method of manufacturing, at the same time on the same substrate, TFTs for a pixel portion having a light-emitting element of the present invention and TFTs (an n-channel TFT and a p-channel TFT) for a driving circuit that is provided in the periphery of the pixel portion. The description will be given with reference to FIGS. 3A to 6C.

First, as shown in FIG. 3A, this embodiment uses a substrate 900 made of barium borosilicate glass, typically Corning #7059 glass and #1737 glass (products of Corning Incorporated), or alumino borosilicate glass. No limitation is put to the material of the substrate 900 as long as it is light-transmissive, and a quartz substrate may be used. A plastic substrate may also be used if it can withstand heat at the process temperature of this embodiment.

Next, a base film 901 is formed on the substrate 900 from an insulating film such as a silicon oxide film, a silicon nitride film, and a silicon oxynitride film. In this embodiment., the base film 901 has a two-layer structure but it may be a single layer or a laminate of the above insulating films. The first layer of the base film 901 is a silicon oxynitride film 901a formed by plasma CVD using as reaction gas $SiH_4$, $NH_3$, and $N_2O$ to have a thickness of 10 to 200 nm (preferably 50 to 100 nm). In this embodiment, the silicon oxynitride film 901a (composition ratio: Si=32%, O=27%, N=24%, H=17%) is 50 nm in thickness. The second layer of the base film 901 is a silicon oxynitride film 901b formed by plasma CVD using as reaction gas $SiH_4$ and $N_2O$ to have a thickness of 50 to 200 nm (preferably 100 to 150 nm). In this embodiment, the silicon oxynitride film 901b (composition ratio: Si=32%, O=59%, N=7%, H=2%) is 100 nm in thickness.

On the base film 901, semiconductor layers 902 to 905 are formed. The semiconductor layers 902 to 905 are formed by patterning into a desired shape a crystalline semiconductor film that is obtained by forming a semiconductor film with an amorphous structure through a known method (sputtering, LPCVD, or plasma CVD) and then by subjecting the amorphous film to a known crystallization treatment (laser crystallization, thermal crystallization., or thermal crystallization using nickel or other catalyst). The semiconductor layers 902 to 905 are each 25 to 80 nm in thickness (preferably 30 to 60 nm). Although the material of the crystalline semiconductor film is not limited, silicon, silicon germanium ($Si_xGe_{1-x}$ (X=0.0001 to 0.02)) alloy or the like is preferred. In this embodiment, an amorphous silicon film with a thickness of 55 nm is formed by plasma CVD and then a solution containing nickel is held to the top face of the amorphous silicon film. The amorphous silicon film is dehydrated (at 500° C. for an hour), then subjected to thermal crystallization (at 550° C. for four hours), and then subjected to laser annealing treatment for improving crystallinity, thereby obtaining the crystalline silicon film. The crystalline silicon film receives patterning treatment by photolithography to form the semiconductor layers 902 to 905.

After the semiconductor layers 902 to 905 are formed, the semiconductor layers 902 to 905 may be doped with a minute amount of impurity element (boron or phosphorus) in order to control the threshold of the TFTs.

If laser crystallization is used to form the crystalline semiconductor film, a pulse oscillation type or continuous wave type excimer layer, YAG laser, or $YVO_4$ laser may be used. When using these lasers, it is appropriate to use an optical system to collect laser light emitted from the laser oscillator into a linear beam before irradiating the semiconductor film. Although conditions of crystallization can be chosen suitably by an operator, preferred conditions are as follows. When an excimer laser is used, the pulse oscillation frequency is set to 300 Hz and the laser energy density is set to 100 to 400 mJ/cm$^2$ (typically, 200 to 300 mJ/cm$^2$). When a YAG laser is employed, the second harmonic thereof is used, the pulse oscillation frequency is set to 30 to 300 kHz, and the laser energy density is set to 300 to 600 mJ/cm$^2$ (typically, 350 to 500 mJ/cm$^2$). The laser light collected into a linear shape is 100 to 1000 mm in width. 400 mm, for example, and the entire surface of the substrate is irradiated with the beam. The overlapping ratio of the linear laser light during irradiation is set to 50 to 90%.

Next, a gate insulating film 906 is formed to cover the semiconductor layers 902 to 905. The gate insulating film 906 is an insulating film containing silicon and formed by plasma CVD or sputtering to have a thickness of 40 to 150 nm. In this embodiment, a silicon oxynitride film (composition ratio: Si=32%, O=59%, N=7%, H=2%) with a thickness of 110 nm is formed by plasma CVD. The gate insulating film is not limited to the silicon oxynitride film, of course, and may be a single layer or a laminate of other insulating films containing silicon.

When a silicon oxide film is used, plasma CVD is employed in which electric discharge is made using a mixture of TEOS (tetraethyl orthosilicate) and O$_2$ and setting the reaction pressure to 40 Pa, the substrate temperature to 300 to 400° C., and the high frequency (13.56 MHZ) power density to 0.5 to 0.8 W/cm$^2$. The thus formed silicon oxide film can provide excellent characteristics as a gate insulating film if it receives subsequent thermal annealing at 400 to 500° C.

On the gate insulating film 906, a heat resistant conductive layer 907 for forming gate electrodes is formed to have a thickness of 200 to 400 nm (preferably 250 to 350 nm). The heat resistant conductive film 907 may be a single layer or may take a laminate structure having a plurality of layers, such as a two-layer structure or a three-layer structure, if necessary. The heat resistant conductive layer contains an element selected from the group consisting of Ta, Ti, and W, or an alloy having the above elements as its ingredient, or an alloy film having the above elements in combination. The heat resistant conductive layer is formed by sputtering or CVD. In order to lower the resistance, the concentration of impurities contained in the layer is preferably reduced. The oxygen concentration in particular, is preferably 30 ppm or less. In this embodiment, a W film with a thickness of 300 nm is formed. The W film may be formed by sputtering with W as the target.

The heat resistant conductive layer 907 may instead be a Ta film, which similarly can be formed by sputtering. Ar is used as sputtering gas when forming a Ta film. If an appropriate amount of Xe or Kr is added to the sputtering gas, the internal stress of the film to be formed is eased and thus the film is prevented from peeling off. Although not shown in the drawings, it is effective to form a silicon film doped with phosphorus (P) to have a thickness of about 2 to 20 nm under the heat resistant conductive layer 907. This improves adhesion to the conductive film formed thereon and prevents oxidation of the conductive film and, at the same time, prevents alkaline metal elements contained in a minute amount in the heat resistant conductive layers 907 and 908 from diffusing into the first shape gate insulating film 906. In either case, the resistivity of the heat resistant conductive layer 907 is preferably set to 10 to 50 μΩcm.

In this embodiment, the TaN film and the W film are formed in the first conductive layer (the first conductive film 907) and the second conductive layer (the second conductive film 908) respectively. (FIG. 3A) Next, resist masks 909 are formed by using the photolithography technique. Then the first etching treatment is conducted. The first etching treatment is conducted by the first etching conditions and the second etching conditions.

In this embodiment, an ICP etching device is employed, Cl$_2$, CF$_4$ and O$_2$ are mixed as etching gas, setting the respective flow rates to 25/25/10 (sccm), and an RF (13.56 MHZ) power of 3.2 W/cm$^2$ is given at a pressure of 1 Pa to generate plasma. The substrate side (sample stage) also receives an RF (13.56 MHZ) power of 224 mW/cm$^2$ so that a substantially negative self-bias voltage is applied. The W film is etched under the first etching conditions. Then, the first etching conditions are switched to the second etching conditions without removal of the resist mask. The second etching conditions include: using as an etching gas CF$_4$ and Cl$_2$; setting of their gas flow rates to 30/30 (sccm); and giving an RF (13.56 MHZ) power at a pressure of 1 Pa to generate plasma. The substrate side (sample stage) also receives an RF (13.56 MHZ) power of 20 W so that a substantially negative self-bias voltage is applied.

Through the first etching treatment, conductive layers 910 to 913 having a first taper shape are formed. The angle of the tapered portions of the conductive layers 910 to 913 is 15 to 30°. In order to etch the conductive films without leaving any residue, over-etching is employed in which the etching time is prolonged by about 10 to 20%. The selective ratio of the W film to the silicon oxynitride film (the gate insulating film 906) is 2 to 4 (typically 3), and therefore a region where the silicon oxynitride film is exposed is etched by about 20 to 50 nm by the over-etching treatment (FIG. 3B).

First doping treatment is conducted next to dope the semiconductor layers with an impurity element of one conductivity type. An impurity element giving the n-type conductivity is used in this doping step without removal of the resist mask 909. The doping of the impurity element imparting the n-type conductivity is conducted by ion doping in a self-aligning manner while using the conductive layers 910 to 913 having the first tapered shape in a part of the semiconductor layers 902 to 905 as masks to form the first n-type impurity element regions 914 to 917. Used as the impurity element that gives the n-type conductivity is an element belonging to Group 15, typically, phosphorus (P) or arsenic (As). Here, phosphorus (P) is used. Through this ion doping, first impurity regions 914 to 917 are formed to contain the impurity element that gives the n-type conductivity in a concentration of $1 \times 10^{20}$ to $1 \times 10^{21}$ atoms/cm$^3$ (FIG. 3B).

Next, second etching treatment is conducted without removal of the resist mask. The second etching treatment is conducted by the third etching conditions and the fourth etching conditions. The second etching treatment, same as the first etching treatment, include: using as an etching gas CF$_4$ and Cl$_2$ and setting the ratio of their respective floe rates to 30/30 (sccm); and giving an RF (13.56 MHZ) power at a pressure of 1 Pa to generate plasma. The substrate side (sample stage) also receives an RF (13.56 MHZ) power of 20W so that a substantially negative self-bias voltage is applied. By the third etching conditions, the conductive films 918 to 921 in which the W film and TaN film are etched to about the same extent are formed. (FIG. 3C)

After that, the fourth etching condition is conducted as the resist mask is remained in its place. In the etching here, an etching gas obtained by mixing, CF$_4$, Cl$_2$ and O$_2$ is used, and an RF (13.56 MHZ) power at a pressure of 1 Pa to generate plasma. The substrate side (sample stage) also receives an RF (13.56 MHZ) power of 20 W so that a substantially negative self-bias voltage is applied. The W film is etched by the fourth etching conditions to form the second conductive films 922 to 925. (FIG. 3D)

Figure 4A:
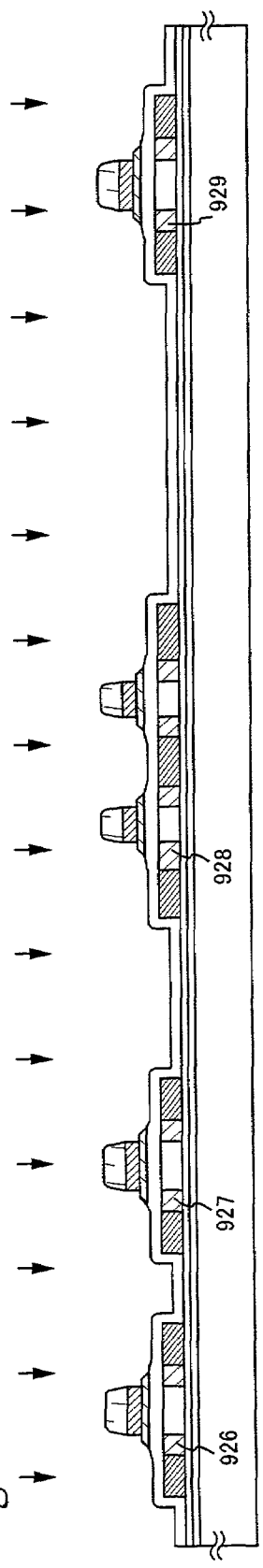
FIGS. 4A to 4C show the processes of manufacturing a light-emitting apparatus.

Next, the second doping process (the doping of the n-type impurity element to the semiconductor layer via the second shape first conductive film 922a to 925a) is conducted, the second n-type impurity regions 926 to 929 is formed at the side of the channel formation region in contact with the first n-type impurity regions 914 to 917. The impurity concentration in the second n-type impurity region is set to $1\times10^{16}$ to $1\times10^{19}$ atoms/cm$^3$. In the second doping process, the conditions is set so as to dope the n-type impurity element to the semiconductor layer even though via the taper portion of the second shape conductive films 922a to 925a of the first layer. In this specification, the second n-type impurity region which is overlapped with the second shape conductive films 922a to 925a and the second n-type impurity region which is not overlapped with the second shape conductive films 922a to 925a are referred to as the Lot ("ov" means "overlapped") and Loff ("off" means "offset", respectively). (FIG. 4A)

Figure 4B:
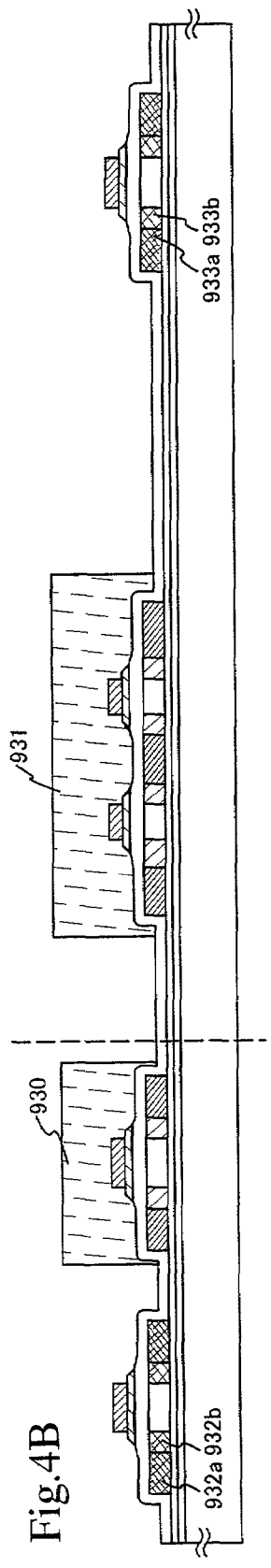

Then as shown in FIG. 4B, impurity regions 932 (932a and 932b) and 933 (933a and 933b) having the conductivity type reverse to the one conductivity type are respectively formed in the semiconductor layers 902 and 905 that are to form p-channel TFTs. In this case, also, the semiconductor layers are doped with an impurity element that gives the p-type conductivity while using as masks the second shape conductive layers 922 and 925 to form the impurity regions in a self-aligning manner. During this doping, the semiconductor layers 903 and 904 that are to form n-channel TFTs are completely covered with resist masks 930 and 931. The impurity regions 932 and 933 here are formed by ion doping using diborane (B$_2$H$_6$). The concentration of the impurity element that gives the p-type conductivity in the impurity regions 932 and 933 is set to $2\times10^{20}$ to $2\times10^{21}$ atoms/cm$^3$.

At a closer look, the p-type impurity regions 932 and 933 contain the impurity element that gives the n-type conductivity. However, the p-type impurity regions 932 and 933 have no problem in functioning as a source region and a drain region of p-channel TFTs if they are doped with the impurity element for imparting the p-type conductivity in a concentration 1.5 to 3 times higher than the concentration of the impurity element that gives the n-type conductivity.

Figure 4C:
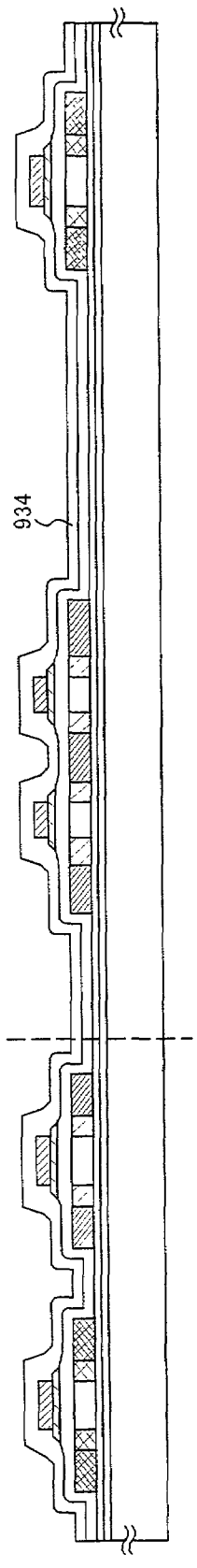

Thereafter, as shown in FIG. 4C, a first interlayer insulating film 934 is formed on the second shape conductive layers 922 to 925 and the gate insulating film 906. The first interlayer insulating film 934 may be a silicon oxide film, a silicon oxynitride film, a silicon nitride film, or a laminate having these films in combination. In either case, the first interlayer insulating film 934 is formed from an inorganic insulating material. The thickness of the first interlayer insulating film 934 is 100 to 200 nm. When a silicon oxide film is used for the first interlayer insulating film 934, plasma CVD is employed in which electric discharge is made using a mixture of TEOS and O$_2$ and setting the reaction pressure to 40 Pa, the substrate temperature to 300 to 400° C., and the high frequency (13.56 MHZ) power density to 0.5 to 0.8 W/cm$^2$. When a silicon oxynitride film is used for the first interlayer insulating film 934, one formed by plasma CVD from SiH$_4$, N$_2$O, and NH$_3$, or one formed by plasma CVD from SiH$_4$ and N$_2$O is chosen. Film formation conditions in this case include setting the reaction pressure to 20 to 200 Pa, the substrate temperature to 300 to 400° C., and the high frequency (60 MHZ) power density to 0.1 to 1.0 W/cm$^2$. A silicon oxynitride hydrate film formed from SiH$_4$, N$_2$O, and H$_2$ may also be used as the first interlayer insulating film 934. Similarly, a silicon nitride film can be formed by plasma CVD from SiH$_4$ and NH$_3$.

Then the impurity elements used in doping to give the n-type and p-type conductivities in the respective concentrations are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 550° C. for four hours. However, if a plastic substrate weak against heat is used for the substrate 900, laser annealing is preferred.

The catalyst element (nickel) used in the process of crystallizing the semiconductor layer is moved (gettered) into the first n-type impurity region to which the element residing in group 15 of the periodic table (phosphorous in this embodiment) and having a gettering action has been added at high concentration. The concentration of the catalyst element in the channel forming region can thus be reduced.

The atmospheric gas is then changed after the activation process, and heat treatment is performed for 1 to 12 hours at 300 to 450° C. in an atmosphere containing between 3 and 100% of hydrogen, performing a process of semiconductor layer hydrogenation. This process is one of terminating from $10^{16}$ to $10^{18}$/cm$^3$ of dangling bonds in the semiconductor layers by hydrogen that is thermally excited. Plasma hydrogenation (using hydrogen excited by a plasma) may also be used as another means of hydrogenation. Whichever method is employed, it is preferable that the fault density within the semiconductor layers 902 to 905 be made equal to or less than $10^{16}$/cm$^3$, and therefore hydrogen on the order of 0.01 to 0.1 atomic % may be imparted.

Then, a second interlayer insulating film 935 of an organic insulating material is formed to have an average thickness of 1.0 to 2.0 μm. As the organic resin material, polyimide, acrylic resin, polyamide, polyimideamide, benzocyclobutene (BCB), or the like can be used. For example, in the case of using polyimide that is thermally polymerized after being applied to the substrate, the polyimide is sintered at 300° C. in a clean oven to be formed into the second interlayer insulating film 935. In the case of using acrylic resin, a 2-liquid type is used. More specifically, a main material and a curing agent are mixed with each other, and applied to the entire surface of the substrate with a spinner; thereafter, the mixture is preliminary heated at 80° C. for 60 seconds by a hot plate, and sintered at 250° C. for 60 minutes in a clean oven, whereby the second interlayer insulating film 935 can be formed.

Thus, by forming the second interlayer insulating film 935 of an organic insulating material, the surface thereof can be flattened satisfactorily. Furthermore, since an organic resin material generally has a low dielectric constant, a parasitic capacitance can be reduced. However, the organic resin material is not suitable for a protective film due to its hygroscopicity. Therefore, as in the present embodiment, a silicon oxide film, a silicon oxynitride film, a silicon nitride film, or the like formed as the first interlayer insulating film 934 may be preferably used in combination with the organic resin material.

Note that, the second interlayer insulating film 935 of an organic insulating material may generate moisture and gas. It is known that a light-emitting element is likely to be degraded due to moisture and gas (oxygen). Actually, it is considered that heat generated during use of a light-emitting device formed by using an organic resin insulating film for an interlayer insulating film causes moisture and gas to be generated from the organic resin insulating film, and the light-emitting element may be more likely to be degraded. In order to avoid this, an insulating film 936 is formed on the second interlayer insulating film 935 formed of an organic insulating material.

The insulating film 936 is formed by using a silicon oxide film, a silicon oxynitride film, a silicon nitride film, or the like. The insulating film 936 may be formed by sputtering or plasma CVD. Furthermore, the insulating film 936 may be formed after forming contact holes.

Thereafter, a resist mask with a predetermined pattern is formed, and contact holes reaching impurity regions, formed in the respective semiconductor layers to be a source region and a drain region, are formed. The contact holes are formed by dry etching. In this case, the insulating film 936 is first etched using a mixed gas of $CF_4$ and $O_2$ as an etching gas. Then, the second interlayer insulating film 935 of an organic resin material is etched by using a mixed gas of $CF_4$, $O_2$, and He. Then, the first interlayer insulating film 934 is etched by again using $CF_4$ and $O_2$ as an etching gas. Furthermore, in order to enhance a selection ratio with respect to the semiconductor layers, the gate insulating film 906 is etched while changing an etching gas to $CHF_3$, whereby contact holes can be formed.

A conductive metal film is then formed by sputtering or vacuum evaporation and patterned with a mask. Thereafter, the conductive metal film is etched to form wirings 937 to 943. Although not shown, in the present embodiment, each of these wirings is formed of a laminate film of a Ti film (50 nm) and an alloy (Al and Ti) film (500 nm).

Then, a transparent conductive film is formed on the wirings to have a thickness of 80 to 120 nm, followed by etching to form a first electrode 944 (FIG. 5A). In the present embodiment, an indium tin oxide (ITO) film or a transparent conductive film obtained by mixing 2 to 20% zinc oxide (ZnO) with indium oxide is used as the transparent electrode.

Furthermore, the first electrode 944 is electrically connected to a drain region of a current control TFT since it is formed so as to be overlapped with the drain wiring 943 (FIG. 5A). Herein, the first electrode 944 may be subjected to a heat treatment at 180° C. to 350° C.

Then, as shown in FIG. 5B, an insulating film 945 of an organic resin material is formed on the first electrode 944. Herein, it is assumed that the TFT substrate is moved to another treatment chamber (clean room) for the purpose of forming the light-emitting element. In order to prevent a TFT substrate from being contaminated with dust in the air or damaged, a very thin film (hereinafter, referred to as an "antistatic film") 946 with an antistatic function is formed on the insulting film 945 of an organic resin material. The antistatic film 946 is formed of a material that is removable by washing with water (FIG. 5C).

After the TFT substrate is transferred to the treatment chamber (clean room) for forming the light-emitting element, the antistatic film 946 is removed by washing with water. Then, the insulating film 945 of an organic resin material is etched to form a first insulating layer 947 with an opening at a position corresponding to the first electrode 944. In the present embodiment, the first insulating layer 947 is formed using a resist. The thickness of the first insulating layer 947 is set to be about 1 μm, and a region of the first insulating layer 947, which covers a portion where the wiring is in contact with the first electrode 944, is formed to be tapered (FIG. 6A).

In the present embodiment, a resist film is used as the first insulating layer 947. In some cases, however, polyimide, polyamide, acrylic resin, benzocyclobutene (BCB), silicon oxide film, or the like may be used as well. The first insulating layer 947 may be formed of either an organic substance or an inorganic substance, as long as it is made of a material with insulating property. In the case of forming the first insulating layer 947 using photosensitive acrylic resin, it is preferable that the photosensitive acrylic film is etched, and then, a heat treatment is conducted at 180° C. to 350° C. Furthermore, in the case of forming the first insulating layer 947 using a non-photosensitive acrylic film, it is preferable that the non-photosensitive acrylic film is heat-treated at 180° C. to 350° C., and then, etched to form a first insulating layer.

Then, the surface of the first electrode 944 is subjected to cleaning by wiping. In the present embodiment, the surface of the first electrode 944 is wiped with BELLCLEAN (produced by Ozu Sangyo), whereby the surface of the first electrode 944 is flattened, and dust adhering thereto is removed. As a detergent for cleaning by wiping, pure water is used. The rotation speed of an axis, around which a polyvinylalcohol (PVA) type porous material is wound, is set to be 100 to 300 rpm, and a push-in value is set to be 0.1 to 1.0 mm (FIG. 6A).

Then, a second insulating layer 948 is formed so as to cover the first insulating layer 947 and the first electrode 944. The second insulating layer 948 is formed to have a thickness of 2.5 nm by plasma CVD using a silicon oxynitride film produced with a mixed gas of $SiH_4$ and $N_2O$.

An organic compound layer 949 and a second electrode 950 are formed on the second insulating layer 948 by vapor deposition. In the present embodiment, a MgAg electrode is used as the second electrode 950 of the light-emitting element. However, another known material may be used as well. The organic compound layer 949 is formed by stacking a combination of a plurality of layers such as a hole injection layer, a hole transport layer, an electron transport layer, an electron injection layer, and a buffer layer, in addition to a light-emitting layer.

In the present embodiment, the hole injection layer is formed of copper phthalocyanine and the hole transport layer is formed of α-NPD, each by vapor deposition.

Organic compound layers which emit light of different colors can be formed by using different materials for light-emitting layers. In the preset example, organic compound layers emitting red, green, and blue light are formed. As the film formation method, vapor deposition is used. Therefore, by using a metal mask during film formation, a light-emitting layer can be formed of a material varied on the pixel basis.

A light-emitting layer emitting red light is formed of $Alq_3$ doped with DCM. In addition, it may be possible to use N,N'(disalicylidene(1,6(hexanediaminate)zinc(II) (Zn (salhn)) doped with an Eu complex (1,10(phenanthroline) tris(1,3(diphenylpropane(1,3(dionate) europium(III) (Eu $(DBM)_3(Phen)$) or the like. However, other known materials may be used as well.

A light-emitting layer emitting green light is formed by co-deposition of CBP and $Ir(Ppy)_3$. In this case, it is preferable that a hole blocking layer has been stacked using BCP. In addition, an alumiquinolinate complex ($Alq_3$), and a benzoquinolinate beryllium complex (BeBq) can be used. An alumiquinolinolate complex ($Alq_3$) doped with coumarin 6 or quinacridon can also be used. However, other known materials may be used as well.

As a light-emitting layer emitting blue light, a distyryl derivative (DPVBi), N,N'(disalicylidene(1,6(hexanediaminate)zinc(II) (Zn(salhn)) that is a zinc complex having a azomethine compound as a ligand, or 4,4'(bis(2,2(diphenylvinyl)(biphenyl(DPVBi) doped with perylene may be used. Other known materials may be used as well.

Next, the electron transport layer is formed. As the electron transport layer, materials such as 1,3,4-oxadiazole derivative, 1,2,4(triazole derivative (TAZ), or the like can be used. In the present embodiment, the electron transport layer is formed to have a thickness of 30 to 60 nm by vapor deposition using 1,2,4(triazole derivative (TAZ).

The thickness of the organic compound layer 949 formed in a laminate as described above may be set to be 10 to 400 nm (typically, 60 to 150 nm), and the thickness of the second electrode 950 may be set to be 80 to 200 nm (typically, 100 to 150 nm).

After the organic compound layer 949 is formed, the second electrode 950 of the light-emitting element is formed by vapor deposition. In the present embodiment, as a conductive film for the second electrode 950 of the light-emitting element, MgAg is used. However, an alloy film of aluminum and lithium (Al—Li alloy film) or a film formed by co-deposition of an element belonging to Group I or II of the periodic table and aluminum can also be used.

Thus, a light-emitting device with a configuration as shown in FIG. 6B is completed. A portion 951 of a laminate of the first electrode 944, the organic compound layer 949, and the second electrode 950 is referred to as a light-emitting element.

A p-channel TFT 1000 and an n-channel TFT 1001 are TFTs of a driving circuit 1004, and constitute a CMOS circuit. A switching TFT 1002 and a current control TFT 1003 are TFTs of a pixel portion 1005. The TFTs of the driving circuit 1004 and the TFTs of the pixel portion 1005 can be formed on the same substrate.

In the case of a light-emitting device using a light-emitting element, a voltage of about 5 to 6 V (about 10 V at maximum) is enough for a power supply of a driving circuit. Therefore, degradation of TFTs due to hot electrons does not become a serious problem. Thus, a light-emitting device emitting light to the substrate 100 side can be completed.

As described above, in the present embodiment, the surface of the first electrode is flattened by cleaning with wiping, and the second insulating that allows a tunnel current or a Fowler-Nordheim current to flow therethrough is formed on the first electrode. This configuration prevents a short-circuit of the light-emitting element and suppresses a defect such as a dark spot, to prolong the life of the light-emitting device and enhance the reliability thereof.

Embodiment 2

In Embodiment 1, the first electrode is formed of Mg—Ag, an Al—Li alloy film, or a film formed by co-deposition of an element belonging to Group I or II of the periodic table and aluminum, and the second electrode is formed of a transparent conductive film material, whereby a light-emitting device emitting light to the opposite side of the substrate 100 can be produced.

Embodiment 3

The processes are conducted in the same way as in Embodiment 1 until the second interlayer insulating film 935 is formed. Then, the second interlayer insulating film 935 is subjected to a plasma treatment, in place of forming the insulating film 936 in Embodiment 1, whereby the surface of the second interlayer insulating film 935 is modified. This method will be described with reference to FIG. 7.

Figure 7:
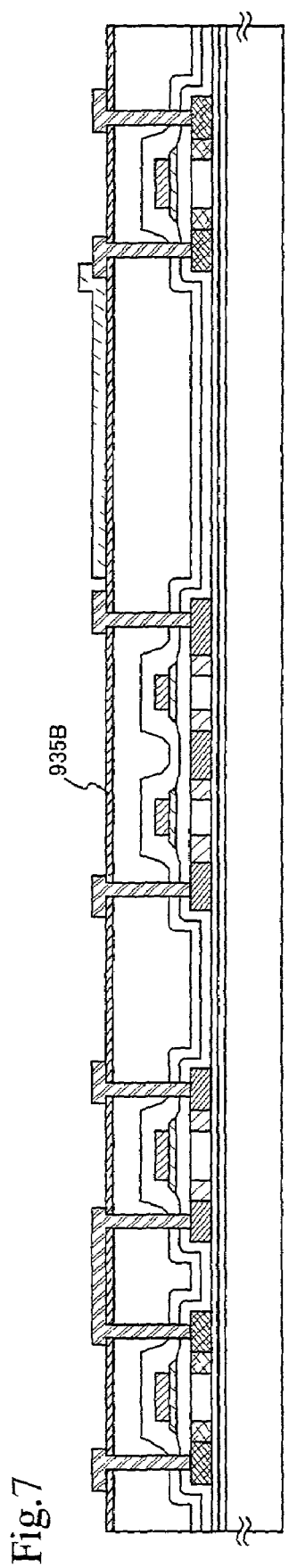
FIG. 7 shows an embodiment mode of the processes of manufacturing a light-emitting apparatus.

The second interlayer insulating film 935 is subjected to a plasma treatment in one kind or a plurality of kinds of gases selected from the group consisting of hydrogen, nitrogen, hydrocarbon, halocarbon, hydrogen fluoride, and noble gas (Ar, He, Ne, etc.), whereby a new coating film is formed on the surface of the second interlayer insulating film 953, or the kind of a functional group present on the surface is changed. As a result, the surface of the second interlayer insulating film 935 can be modified. On the surface of the second interlayer insulating film 935, a densified film 935B is formed as shown in FIG. 7. This film is referred to as a cured film. Because of this, gas and moisture can be prevented from being released from the organic resin film.

Furthermore, the first electrode (ITO) is formed after the surface of the second interlayer insulating film 935 is modified. Therefore, a heat treatment is not conducted under the condition that materials with different thermal expansion coefficients are in direct contact with each other. This prevents cracks or breaks from being generated in ITO, and also prevents a light-emitting element from being degraded. The second interlayer insulating film 935 may be subjected to a plasma treatment before or after contact holes are formed.

The cured film 935B is formed by subjecting the surface of the second interlayer insulating film 935 of an organic insulating material to a plasma treatment in one kind or a plurality of kinds of gases selected from the group consisting of hydrogen, nitrogen, hydrocarbon, halocarbon, hydrogen fluoride, and noble gas (Ar, He, Ne, etc.). Therefore, it is considered that a gas element of hydrogen, nitrogen, hydrocarbon, halocarbon, hydrogen fluoride, or noble gas (Ar, He, Ne, etc.) is contained in the cured film 935B.

Embodiment 4

Figure 12:
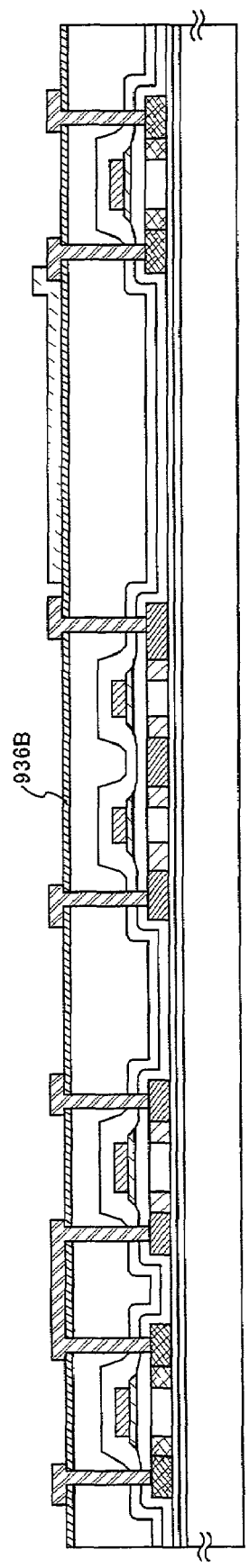
FIG. 12 shows an embodiment mode of the processes of manufacturing a light-emitting apparatus.

The processes are conducted in the same way as in Embodiment 1 until the second interlayer insulating film 935 is formed. Then, as shown in FIG. 12, a DLC film 936B may be formed as the insulating film 936 on the second interlayer insulating film 935.

The DLC film is characterized by having Raman spectrum distribution with an asymmetric peak at around 1550 cm$^{-1}$ and a shoulder at around 1300 cm$^{-1}$. The DLC film also exhibits a hardness of 15 to 25 GPa measured by a micro hardness meter, and is excellent in resistance to drug. Furthermore, the DLC film can be formed by CVD or sputtering in a range of room temperature to 100° C. As a film formation method, sputtering, ECR plasma CVD, high-frequency plasma CVD, or ion beam vapor deposition may be used. The DLC film may be formed to a thickness of about 5 to 50 nm.

Embodiment 5

The processes are conducted in the same way as in Embodiment 1 until the second interlayer insulating film 935 is formed. Then, as shown in FIG. 13, after the cured film 935B is formed by modifying the surface of the second interlayer insulating film 935 with a plasma treatment, the DLC film 936B may be formed on the cured film 935B. The DLC film 936B may be formed to a thickness of about 5 to 50 nm by sputtering, ECR plasma CVD, high-frequency plasma CVD, ion beam vapor deposition, or the like.

Embodiment 6

After the first insulating layer 947 is formed in accordance with the processes of Embodiment 1, the first insulating layer 947 is subjected to a plasma treatment, whereby the surface thereof is modified. This example will be described with reference to FIG. 8.

The first insulating layer 947 is formed of an organic resin insulating film. Such a layer occludes moisture and gas in the air, which are released due to heat generated by driving of a light-emitting element to cause degradation of the element.

Figure 8:
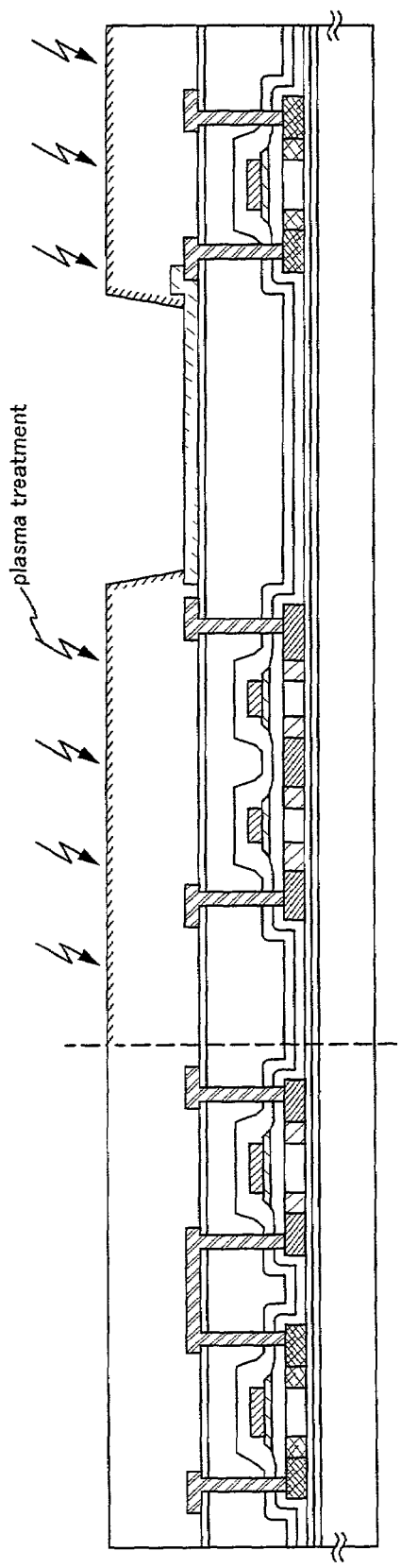
FIG. 8 shows an embodiment mode of the processes of manufacturing a light-emitting apparatus.

In order to solve the above-mentioned problem, as shown in FIG. 8, the first insulating layer 947 is subjected to a plasma treatment in one kind or a plurality of kinds of gases selected from the group consisting of hydrogen, nitrogen, halocarbon, hydrogen fluoride, and noble gas so as to modify the surface of the first insulating layer 947. Because of this, the surface of the first insulating layer 947 is modified to become dense, and a cured film containing one kind or a plurality of kinds of gas elements selected from the group consisting of hydrogen, nitrogen, halocarbon, hydrogen fluoride, and noble gas, is formed. The cured film can prevent moisture and gas (oxygen) from being generated from the inside to avoid degradation of a light-emitting element.

The present embodiment can be used in combination with any of Embodiments 1 to 5.

Embodiment 7

In this embodiment, the semiconductor film which is to be an active layer of the TFT is crystallized using a catalyst element. A method of decreasing the concentration of the catalyst element in obtained crystalline semiconductor film is described.

Figure 14A:
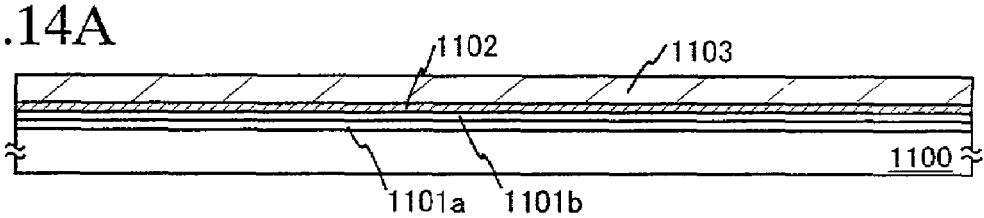
FIGS. 14A to 14F show an embodiment mode of the processes of manufacturing a light-emitting apparatus.

Preferably, a material such as barium borosilicate glass, alumino-borosilicate glass. or quartz can be used as a substrate 1100 in FIG. 14A. An inorganic insulating film is formed on the surface of the substrate 1100 to have a thickness of 10 to 200 nm as a base insulating film 1101. One example as a preferable base insulating film is a silicon oxynitride film manufactured by plasma CVD. A first silicon oxynitride film 1101a manufactured from $SiH_4$, $NH_3$, and $N_2O$ with a thickness of 50 nm, and a second silicon oxynitride 1101b film manufactured from $SiH_4$ and $N_2O$ with a thickness of 100 nm are employed. The base insulating film 1101 is formed so that alkaline metals contained in the glass substrate do not diffuse into a semiconductor film to be formed later, and it is possible to omit the base insulating film if quartz is used as the substrate.

Next, a silicon nitride film 1102 is formed on the base insulating film 1101. The silicon nitride film 1102 is formed in order to prevent contamination of the base insulating film 1101 due to catalytic elements (typically nickel) used during a later process of crystallizing the semiconductor film, and in addition, in order to prevent oxygen contained in the base insulating film 1101 from causing any adverse influence. Note that the silicon nitride film 1102 may be formed by plasma CVD to have a film thickness of 1 to 5 nm.

An amorphous semiconductor film 1103 is then formed on the silicon nitride film 1102. A semiconductor material which has silicon as its main component is used as the amorphous semiconductor film 1103. A film such as an amorphous silicon film or an amorphous silicon germanium film is typically applied, and formed to have a thickness of 10 to 100 nm by plasma CVD, reduced pressure CVD, or sputtering. The concentration of impurities such as oxygen and nitrogen contained in the amorphous semiconductor film 1103 may be reduced to be equal to, or less than, $5 \times 10^{18}/cm^3$ in order to obtain satisfactory crystals. These impurities become factors in hindering crystallization of the amorphous semiconductor, and further, cause the density of captures centers and recombination centers to increase. It is therefore preferable to use high purity material gasses, and to use a CVD apparatus which is capable of an extremely high vacuum, in which the inside of the reaction chamber has undergone mirror surface processing (electric field polishing processing), and which is prepared with an oil free vacuum evacuation system. Note that successive film formation can be performed from the base insulating film 1101 to the amorphous semiconductor film 1103, without exposure to the atmosphere.

Figure 14B:
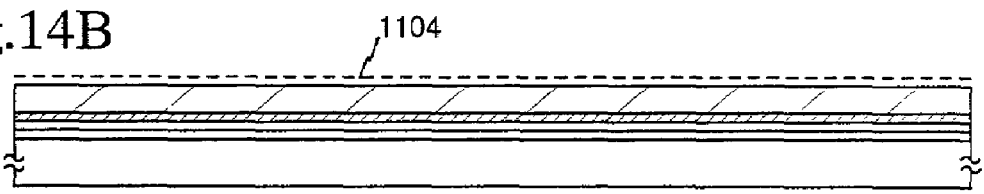

A metallic element that has a catalytic function of promoting crystallization is then added to the surface of the amorphous semiconductor film 1103 (see FIG. 14B). One element, or a plurality of elements, selected from the group consisting of iron (Fe), nickel (Ni), cobalt (Co), ruthenium (Ru), rhodium (Rh) palladium (Pd), osmium (Os), iridium (Ir), platinum (Pt), copper (Cu) and gold (Au) can be used as the metallic element that has a catalytic function of promoting crystallization of a semiconductor film. Nickel is typically used, and a catalyst containing layer 1104 is formed by applying a nickel acetate salt solution containing nickel of 1 to 100 ppm by weight, using a spinner. An extremely thin oxide film may be formed using ozone containing aqueous solution as a surface treating to the amorphous silicon film 1103 in order to increase the compatibility of the liquid. Then, a clean surface is formed after etching the oxide film using a mixed solution of hydrofluoric acid and hydrogen peroxide, and an extremely thin oxide film is formed once again by processing with ozone containing aqueous solution. The surface of the semiconductor film such as silicon is initially hydrophobic, and therefore a uniform application of the nickel acetate salt solution can be achieved by thus forming the oxide film.

The catalyst containing layer 1104 may also be formed using sputtering, evaporation, plasma processing, or the like without being limited to the above-mentioned method.

Figure 14C:
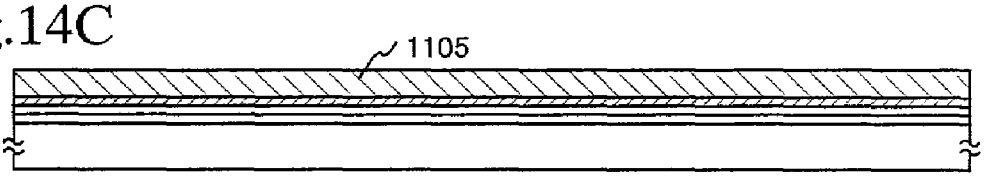

Heat treatment is performed for crystallization while the amorphous semiconductor film 1103 and the catalytic element containing layer 1104 are in contact with each other. A furnace annealing method using an electric furnace, or a RTA method using a heat source such as a halogen lamp, a metal halide lamp, a xenon arc lamp, a carbon arc lamp, a high pressure sodium lamp, or a high pressure mercury lamp is employed as the heat treatment method. Further, an RTA method by heating gas using a heated inert gas can also be employed. a light source of a heat treatment lamp is turned on for 1 to 60 seconds, preferably for 30 to 60 seconds, and the operation is repeated 1 and 10 times. preferably 2 to 6 times, in the case of performing the RTA method. Although The intensity of light emitted from the lamp light source may be arbitrarily set, it is preferable to set the intensity so that the semiconductor film is instantaneously heated to a temperature of 600 to 1000° C., preferably up to about 650 to 750° C. Even with such a high temperature, the semiconductor film is only heated instantaneously, and therefore the substrate 1100 itself is not distorted to change the shape. The amorphous semiconductor film can thus be crystallized, and a crystalline silicon film 1105 can thus be obtained as shown in FIG. 14C. Crystallization with the above process is first achieved by forming the catalytic element containing layer.

Heating treatment is performed at 500° C. for about 1 hour as a pre-treatment to release hydrogen contained in the amorphous silicon film 1103, in the case of using furnace annealing as another method for heat treatment. Heat treatment is then performed within a nitrogen atmosphere using an electric furnace at a temperature of 550 to 600° C., preferably at 580° C., for four hours, to crystallize the amorphous silicon film 1103. The crystalline silicon film 1105 shown in FIG. 14C is thus formed.

In addition, irradiation of laser light to the crystalline silicon film 1105 is effective for increasing the crystallinity (the proportion of crystal components in the entire volume of the film) and for repairing faults remaining within crystal grains.

The catalytic element (nickel here) with an average concentration that exceeds $1\times10^{19}/cm^3$ remains in the crystalline silicon film 1105 thus obtained. If the catalytic element remains in the crystalline film, there is a possibility exerting an adverse influence on the TFT properties, and therefore it is necessary to reduce the concentration of the catalytic element in the semiconductor layer. A method of reducing the concentration of the catalytic element in the semiconductor layer after crystallization process is explained here.

Figure 14D:
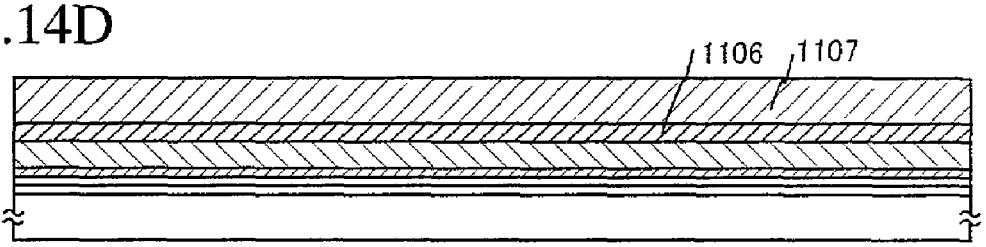

First, a thin layer 1106 is formed on the surface of the crystalline semiconductor film 1105 as shown in FIG. 14D. The thin layer 1106 formed on the crystalline semiconductor film 1105 is a layer formed so that the crystalline semiconductor film 1105 will not be etched in removing gettering sites later, and is referred to as a barrier layer 1106 in this specification.

The thickness of the barrier layer 1106 is set to be 1 to 10 nm, and a chemical oxide formed simply by processing with aqueous ozone may be used as the barrier layer. Further, a chemical oxide can also be similarly formed by processing with an aqueous solution in which a material such as sulfuric acid, hydrochloric acid or nitric acid is mixed with aqueous hydrogen peroxide. In addition, plasma processing within an oxidizing atmosphere, and oxidation processing in which ozone is generated by ultraviolet light irradiation in an atmosphere containing oxygen may also be performed as other methods. Further, a thin oxide film may also be formed as the barrier layer by heating to a temperature of 200 to 350° C. using a clean oven. Alternatively, an oxide film with a 1 to 5.0 nm thick may be deposited by a method such as plasma CVD, sputtering, or evaporation as the barrier layer. Whichever method is employed, any film is used provided that the catalytic elements can move to the gettering sites during gettering processing, and an etching liquid used during removal of the gettering sites does not permeate (protecting the crystalline silicon film 1105 from the etching liquid). For example, a chemical oxide film formed by processing with aqueous ozone, a silicon oxide film (SiOx), and a porous film may be used.

A semiconductor film containing a rare gas element at a concentration equal to or greater than $1\times10^{20}/cm^3$ (typically an amorphous silicon film) is then formed by sputtering to have a thickness of 25 to 250 nm on the barrier layer 1106, and the semiconductor film is formed as gettering sites 1107. In order to increase the etching selectivity of the gettering sites 1107, which are later removed, with respect to the crystalline semiconductor film 1105, it is preferable to form a low density film.

Note that the rare gas itself is inert within the semiconductor film, and therefore does not exert any adverse influence on the crystalline semiconductor film 1105. Further, one element, or a plurality of elements, selected from the group consisting of helium (He), neon (Ne), argon (Ar), krypton (Kr), and xenon (Xe), is used as the rare gas element. The present invention is characterized in that the rare gas element is used as ion sources in order to form gettering sites, a semiconductor film containing the element is formed, and the film is used as gettering sites.

It becomes necessary to perform heat treatment afterward in order to achieve gettering with certainty. Furnace annealing or RTA is performed for the heat treatment. When furnace annealing is used, heat treatment is performed for 0.5 to 12 hours at a temperature of 450 to 600° C. in a nitrogen atmosphere. Further, if RTA is used, a light source of a heating lamp is turned on for 1 to 60 seconds, preferably for 30 to 60 seconds, and this operation is repeated 1 and 10 times, preferably 2 and 6 times. Although the intensity of light emitted from the lamp light source may be arbitrarily set, the semiconductor film is necessary to be heated instantaneously to a temperature of 600 to 1000° C., preferably up to about 700 and 750° C.

Figure 14E:
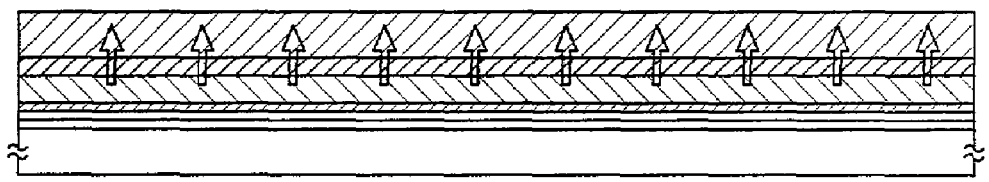

During gettering, the catalytic elements in a region to be gettered (capture site) are released by thermal energy, and then move to the gettering sites by diffusion. Gettering therefore depends on the processing temperature, and the time required for gettering becomes shorter as the processing temperature becomes higher. The distance that the catalytic elements move during gettering is a distance on the order of the film thickness of the semiconductor film in this gettering process, and therefore gettering can be accomplished in a relatively short amount of time (see FIG. 14E).

Note that the semiconductor film 1107 containing the rare gas elements at a concentration of $1\times10^{19}$ to $1\times10^{21}/cm^3$, preferably between $1\times10^{20}$ to $1\times10^{21}/cm^3$, more preferably at $5\times10^{20}/cm^3$ is not crystallized by this heat treatment. It is considered as the reason that the rare gas elements are not released and remain within the film in the aforementioned range of processing temperatures, thus inhibiting crystallization of the semiconductor film.

The gettering sites 1107 are selectively etched and removed after the gettering process is complete. Dry etching by $ClF_3$ without using plasma, and wet etching by an alkaline solution such as an aqueous solution containing hydrating or tetraethyl ammonium hydroxide (chemical formula $(CH_3)_4NOH$) can be used as an etching method. The barrier layer 1106 functions as an etching stopper at this time. Further, the barrier layer 1106 may be removed by using hydrofluoric acid.

Figure 14F:

A crystalline semiconductor film 1108, in which the concentration of the catalytic element is reduced to be equal to or less than $1\times10^{17}/cm^3$ can thus be obtained, as shown in FIG. 14F. The crystalline semiconductor film 1108 is formed as thin rod shape or thin flattened rod shape crystals due to the catalyst action, and there is a specific directionality of crystal growth when each of the crystals is viewed macroscopically.

Embodiment 7 can be used in combination with Embodiments 1 to 6.

Embodiment 8

In this embodiment, the following will specifically describe a process in which the light-emitting device produced as illustrated in FIG. 6B according to the combination of manufacturing process in Embodiments 1 to 7 is completed by incorporating a sealing material and an external input wiring with referring to FIGS. 9A and 9B.

FIG. 9A is a top view of the light-emitting panel wherein the element substrate is airtightly sealed, and FIG. 9B is a sectional view taken along line A-A' of FIG. 9A. Reference number 801 represents a source driving side circuit illustrated by dot lines; reference number 802, a pixel section; reference number 803, a gate side driving circuit; reference number 804, a sealing substrate; and reference number 805, a sealing agent. The inside surround by the seal agent 805 is a space 807.

Through wirings (not illustrated) for transmitting signals inputted to the source side driving circuit 801 and the gate side driving circuit 803, video signals or clock signals are received from a flexible print circuit (FPC) 809, which is an external input terminal. The state that the FPC is connected to the light-emitting panel is shown herein. The present specification, any module on which integrated circuits (ICs) are directly mounted thorough the FPC is referred to as a light-emitting device.

Referring to FIG. 9B, the following will describe the sectional configuration of the light-emitting panel illustrated in FIG. 9A. The pixel section 802 and the gate side driving circuit 803 are formed over a substrate 810. The pixel section 802 has a plurality of pixels, each of which includes a current-controlling TFT 811 and the first electrode (pixel electrode) 812 connected electrically to a drain of the current-controlling TFT 811. The gate side driving circuit 803 is composed of a CMOS circuit wherein an n-channel type TFT 813 and a p-channel type TFT 814 are combined with each other.

The first insulating layer (bank) 815 is formed at both sides of the first electrode 812. Thereafter, an insulating film 821, an organic compound layer 816 and a second electrode 817 are formed on the first electrode 812 to produce light-emitting elements 818. The second electrode 817 function as a common wiring to all of the pixels, and are electrically connected to the FPC 809 through a connecting wiring 808.

The sealing substrate 804 of glass is stuck to the substrate 810 with the sealing agent 805. As the sealing agent 805, an ultraviolet setting resin or thermosetting resin is preferably used. If necessary, a spacer of a resin film may be disposed in order to keep an interval between the sealing substrate 804 and the light-emitting elements 818. An inert gas such as nitrogen or rare gas is filled in the space 807 surrounded by the sealing agent 805. It is desired that the sealing agent 805 is a material which permeate water or oxygen as little as possible.

By putting the light-emitting elements airtightly into the space 807 in the above-mentioned configuration, the light-emitting elements can be completely shut off from the outside, and it is possible to prevent the deterioration of the light-emitting elements due to water or oxygen from the outside. Accordingly, a light-emitting device with high reliability can be yielded.

Embodiment 9

Figure 10A:
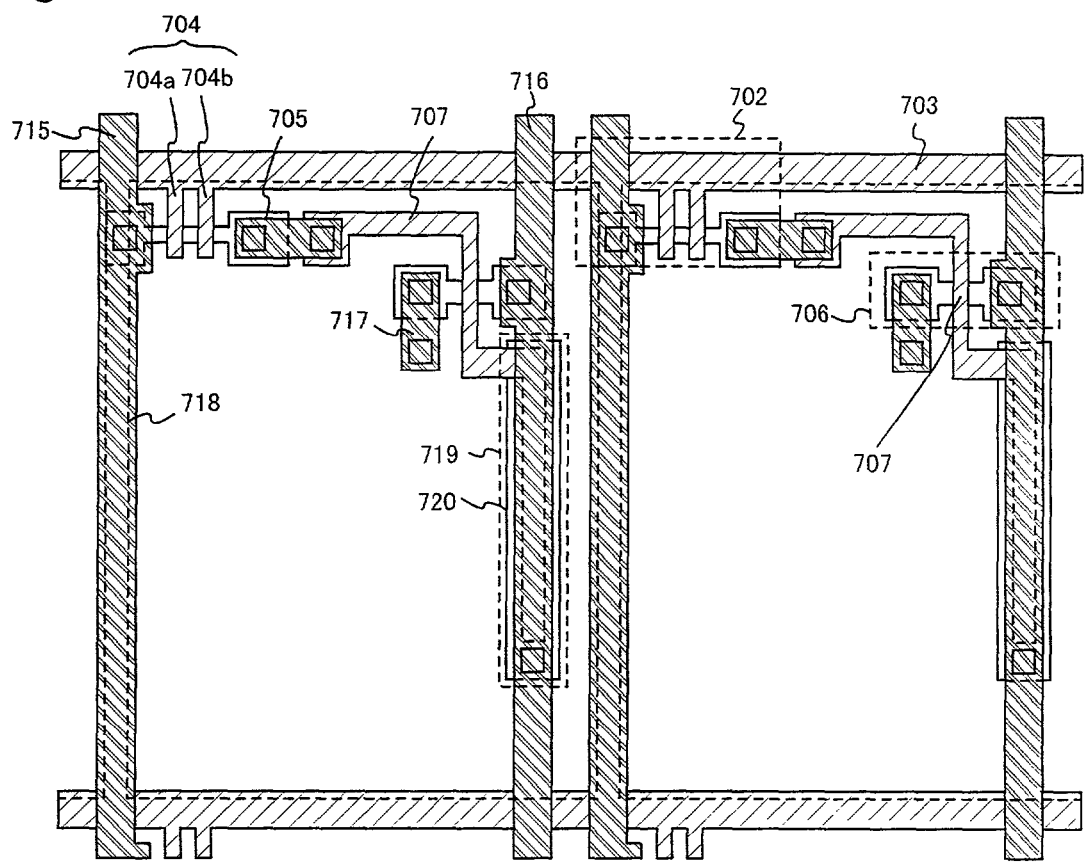
FIGS. 10A and 10B show a structure of a pixel portion of a light-emitting apparatus.
Figure 10B:
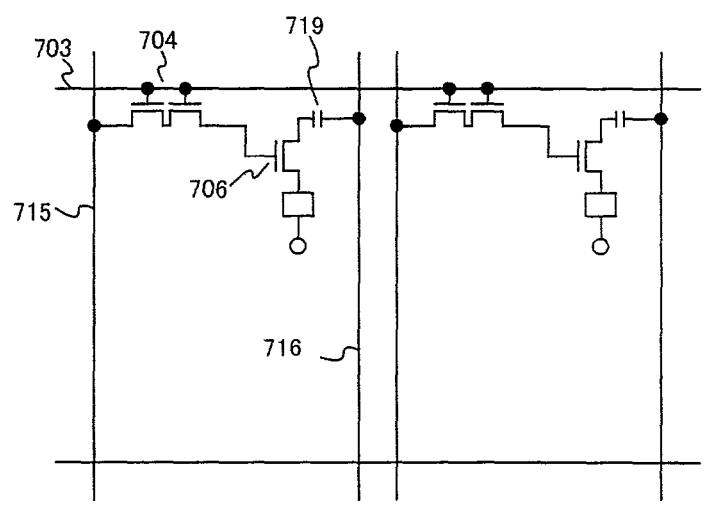

A more detailed top surface structure of a pixel portion of a light-emitting device formed using the present invention is shown in FIG. 10A, and a circuit diagram is shown in FIG. 10B. In FIGS. 10A and 10B, a switching TFT 704 formed on a substrate is formed using the switching (n-channel) TFT 1002 in FIG. 6B. The explanation of the switching (n-channel) TFT 1002 may therefore be referred to as the explanation on the structure of the switching TFT 704. Further, a wiring denoted by reference numeral 703 is a gate wiring electrically connected to gate electrodes 704a and 704b of the switching TFT 704.

Note that although the TFT shown in FIG. 10A has a double gate structure with two channel forming regions formed, a single gate structure with one channel region formed or a triple gate structure with three channel forming regions formed may also be used.

Further, a source of the switching TFT 704 is connected to a source wiring 715, and a drain is connected to a drain wiring 705. The drain wiring 705 is electrically connected to a gate electrode 707 of an electric current control TFT 706.

Note that the electric current control TFT 706 is formed using the electric current control (p-channel) TFT 1003 of FIG. 6B. The explanation on the structure of the electric current control (p-channel) TFT 1003 may therefore be referred to an explanation on the structure of the electric current control TFT 706. Note that although a single gate structure is used in Embodiment 9, a double gate structure or a triple gate structure may also be used for the electric current control TFT 706.

A source of the electric current control TFT 706 is electrically connected to an electric current supply line 716, and a drain is electrically connected to a drain wiring 717. Furthermore, the drain wiring 717 is electrically connected to a first electrode (anode) 718 shown by a dotted line.

A storage capacitor is formed in a region shown by reference numeral 719. The storage capacitor 719 is formed by a semiconductor film 720 that is electrically connected to the electric current supply line 716, an insulating film (not shown) which is the same layer as a gate insulating film, and the gate electrode 707. It is also possible to use a capacitance formed by the gate electrode 707, a layer that is the same layer as a first interlayer insulating film (not shown), and the electric current supply line 716 as a storage capacitor.

Note that it is possible to implement the constitution of Embodiment 9 in combination with the constitution of Embodiments 1 to 8.

Embodiment 10

In Embodiment 10, there will be a description with respect to a portion of a terminal (connection terminal) of a roundabout wiring on a device substrate for supplying a signal and a power supply voltage output from an integrated circuit (IC) to a pixel portion and a driving circuit.

Herein, the connection terminal is formed simultaneously with a wiring directly connected to a source region and a drain region of a TFT in a pixel portion or a driving circuit. The configuration of the connection terminal is not limited to that of the present embodiment. The connection terminal may be formed simultaneously with a gate electrode of a TFT. Alternatively, a process for forming the connection terminal only may be separately provided.

Figure 15A:
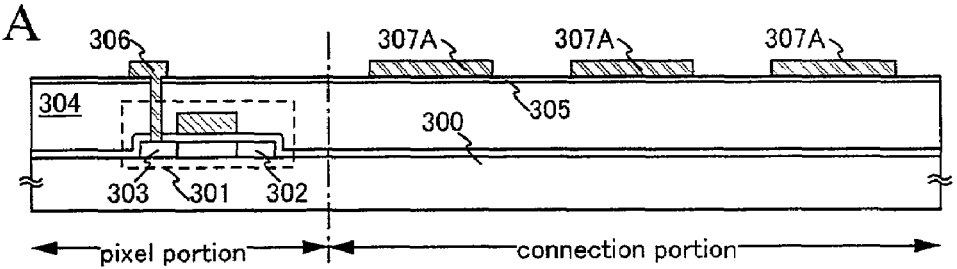
FIGS. 15A to 15E show an embodiment of the processes of manufacturing a light-emitting apparatus.

In FIG. 15A, a TFT 301 is formed on a substrate 300. In FIGS. 15A to 15E, the left part from a broken line shows cross-sectional views of a pixel portion, and the right part shows cross-sectional views of a connection portion where a connection terminal is formed. A TFT shown herein is a current control TFT 301 for controlling a current flowing through a light-emitting element. A source region 302 and a drain region 303, in which an impurity of one conductivity is added, respectively, are formed in a semiconductor film of the TFT 301.

A first interlayer insulating film 304 is formed on the current control TFT 301. The first interlayer insulating film 304 is formed of an organic resin material such as polyimide, acrylic resin, or polyimideamide. The surface of the first interlayer insulating film 304 can be flattened when sintering or polymerizing these materials by heating is performed after applying them with spinner. Furthermore, the organic resin material generally has a low dielectric constant, so that a parasitic capacitance can be reduced.

Then, a second interlayer insulating film 305 is formed on the first interlayer insulating film 304 so that gas released from the first interlayer insulating film 304 does not adversely affect a light-emitting element. The second interlayer insulating film 305 may be formed of an inorganic insulating film (typically, a silicon oxide film, a silicon oxynitride film, a silicon nitride film), or a laminate film of a combination of these films. The second interlayer insulating film 305 is formed by plasma CVD of discharging with a power density of 0.1 to 1.0 W/cm² at a high frequency (13.56 MHZ) under a reaction pressure of 20 to 200 Pa and a substrate temperature of 300° C. to 400° C. Alternatively, the following may also be possible: the surface of the first interlayer insulating film is subjected to a plasma treatment, and a densified film containing one kind or a plurality of kinds of gas elements, selected from the group consisting of hydrogen, nitrogen, halocarbon, hydrogen fluoride and noble gas, is formed.

Thereafter, a resist mask with a desired pattern is formed and a contact hole reaching a drain region 303 of a current control TFT 301 is formed. Then, a conductive film is formed by sputtering or vapor deposition and patterned, whereby a wiring 306 contacting the drain region 303 and a plurality of first connection terminals 307A are formed. As a material for the conductive film, conductive metal such as Al, Ti, as well as an alloy material thereof can be used.

Figure 15B:
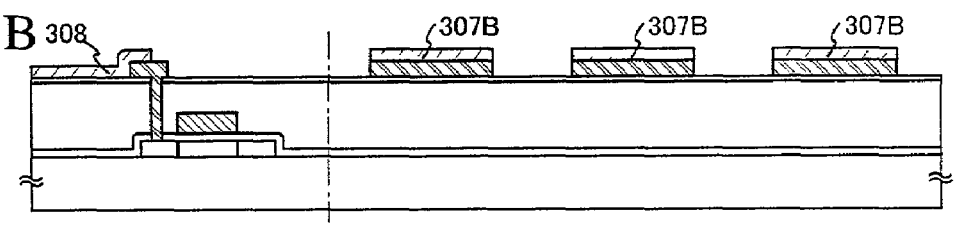

Then, as shown in FIG. 15B, a transparent conductive film in which 2 to 20% of zinc oxide (ZnO) is mixed with indium tin oxide (ITO) or indium oxide is formed and etched, whereby a first electrode 308 in contact with the wiring 306 and second connection terminals 307B in contact with each of the plurality of first connection terminals 307A are formed. Hereinafter, the first connection terminal 307A and the second connection terminals 307B will be collectively referred to as a connection terminal 307.

As will be described later, in the case where a second insulating layer is formed of one kind or a plurality of kinds selected from the group consisting of silicon oxide, silicon nitride, and silicon oxynitride, ITO is used as a transparent conductive film. In the case where the second insulating layer is formed of DLC, ZnO or a compound of ZnO and ITO is used for the transparent conductive film, whereby the second insulating layer can be formed with good adhesion.

Figure 15C:
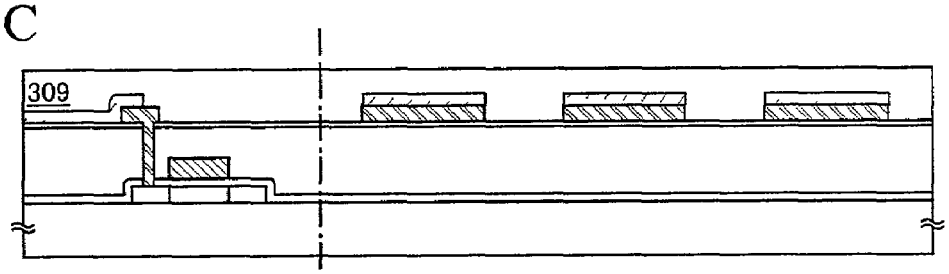

Then, as shown in FIG. 15C, an organic resin film 309 of polyimide, acrylic resin, or polyimideamide is formed over the entire surface of the resultant substrate. As a material for the organic resin film 309, a thermosetting material that is cured by heating or a photosensitive material that is cured by irradiation of UV-light can be used.

Figure 15D:
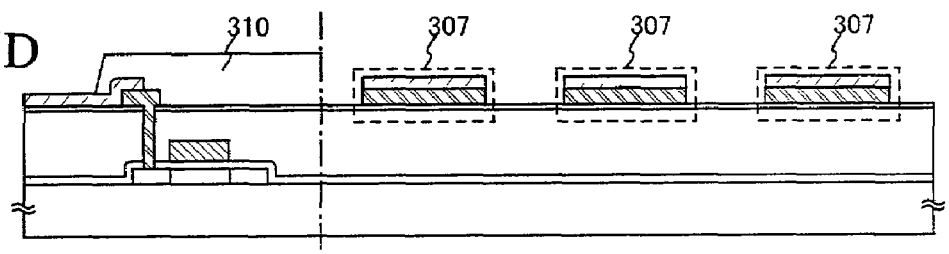
Figure 15E:
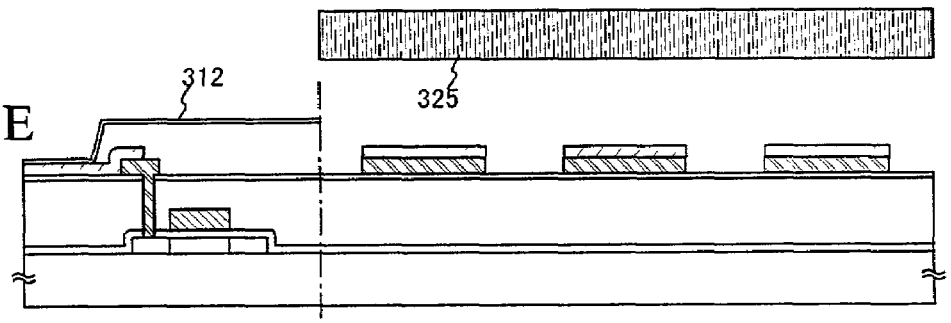

As shown in FIG. 15D, in the case where a thermosetting material is used, a resist mask is formed, and the organic resin film 309 is dry-etched, whereby a first insulating layer 310 with an opening on the first electrode 308 is formed in the pixel portion. In the connection portion, the organic resin film 309 is completely removed by dry etching to expose the connection terminal 307.

In the case of using a photosensitive material, light-exposure and development are conducted using a photomask, whereby the first insulating layer 310 with an opening on the first electrode 308 is formed. In any case, the first insulating layer 310 is formed so as to cover an end portion of the first electrode 308 and have an edge in a taper shape. By forming a tapered edge, coverage of a second insulating layer and an organic compound layer to be formed later can be made satisfactory.

Then, the surface of the first electrode 308 is wiped with a detergent and a polyvinyl alcohol (PVA) type porous material together, whereby the surface of the first electrode 308 is flattened and dust and the like are removed therefrom.

Thereafter, the resultant substrate is heated at 200° C. to 300° C., preferably 250° C., whereby moisture contained in the first insulating layer 310 is released. Because of this, a change in volume and dehydration of the first insulating layer can be prevented after the light-emitting element is completed. Thus, a light-emitting device can be provided in which initial degradation thereof does not occur and stability is ensured for a long period of time.

After the surface of the first electrode 308 is cleaned by wiping, a second insulating layer 312 is formed in the pixel portion. The second insulating layer 312 is formed of an insulating material mainly containing one kind or a plurality of kinds selected from the group consisting of silicon oxide, silicon nitride and silicon oxynitride, or carbon. It is preferable to use a silicon oxynitride film formed by plasma CVD using a mixed gas of $SiH_4$ and $N_2O$. The ratio between oxygen (O) and nitrogen (N) contained in the silicon oxynitride film is set to be (O/(N+O))=0.8 to 1.2. By setting the composition ratio as such, light transparency in a region with a short wavelength is enhanced, and a blocking property of alkali metal and alkaline earth metal is enhanced.

Figure 16:
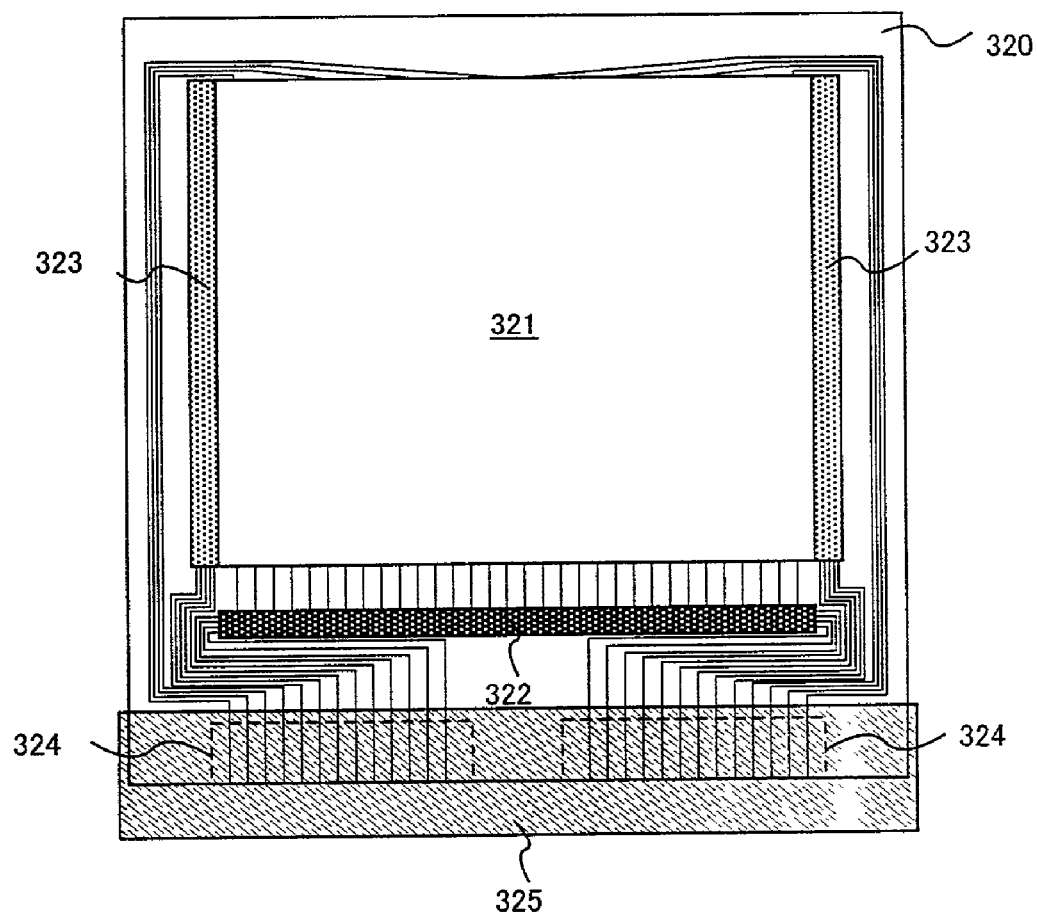
FIG. 16 shows an embodiment of the processes of manufacturing a light-emitting apparatus.

In the connection portion, the second insulating layer 312 is not formed on the connection terminal 307. In the present embodiment, the second insulating layer 312 is formed while the connection portion is covered with a metal mask 325. FIG. 16 is a top view of a device substrate when the second insulating layer 312 is formed in the present embodiment. Reference numeral 320 denotes a device substrate, which includes a pixel portion 321, a source-side driving circuit 322, a gate-side driving circuit 323, and a connection portion 324. Reference numeral 325 denotes a metal mask, which covers the connection portion 324.

Means for forming the second insulating layer 312 so as not to be provided on the connection terminal 307 is not limited to a mask, and a known method can be used. In addition, the similar effect of the second insulating layer 312 can be obtained by using an insulating film mainly containing carbon. A typical example thereof includes DLC.

The second insulating layer 312 is interposed between the first insulating film 308 and the organic compound layer to be formed later. Therefore, the thickness of the second insulating layer 312 needs to be set so that a tunnel current flows therethrough. Therefore, the thickness of the second insulating layer 312 is set to be 1 to 10 nm, preferably 2 to 3 nm.

Next, an organic compound layer and a second electrode are formed. Regarding the formation of the organic compound layer and the second electrode, the description of FIG. 1 can be referred to. Therefore, the description thereof will be omitted here.

As described above, the second insulating layer that allows a tunnel current to flow therethrough and has a thickness of about 1 to 10 nm (preferably about 2 to 3 nm) is formed on the first electrode, whereby minute unevenness on the surface of the first electrode (anode) can be flattened, and the organic compound layer can be formed uniformly. Even if unevenness and foreign matters at tens of to hundreds of nm are present on the first interlayer insulating film 304 or the second interlayer insulating film 305, a dark spot and a defect (non-lighting of a light-emitting element due to a short-circuit between the first and second electrodes) can be prevented by forming the second insulating layer.

By providing the second insulating layer 312, degassing from the first insulating layer 310 formed of an organic resin material such as polyimide, polyamide, and acrylic resin can be prevented, and the organic compound layer 313 can be prevented from being degraded. Furthermore, Li and Mg constituting the second electrode 314 can be prevented from diffusing toward the current control TFTs 301 side.

The configuration of the present embodiment can be implemented in combination with those of Embodiments 1 to 9.

Embodiment 11

In the present embodiment, the structure of a connection portion which is different from that of Embodiment 10 will be described.

Figure 17:
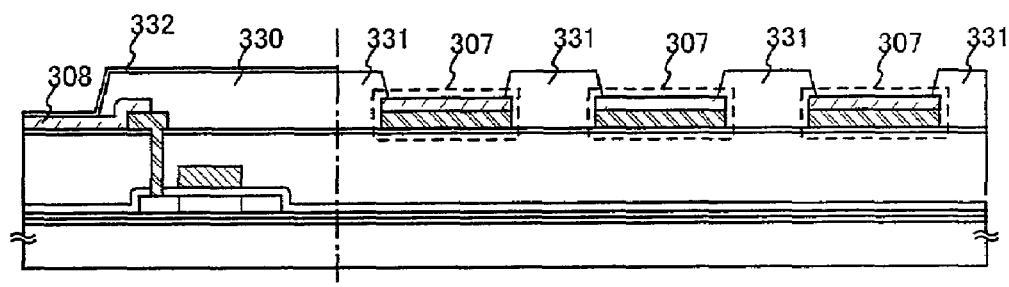
FIG. 17 shows an embodiment of the processes of manufacturing a light-emitting apparatus.

The organic resin film 309 is etched as shown in FIG. 17 after the organic resin film 309 of polyimide, acrylic resin, or polyimideamide is formed as shown in FIG. 15C. In the case where a thermosetting material is used for the organic resin film 309, dry etching is conducted after a resist mask is formed. With this dry etching, a first insulating layer 330 with an opening on the first electrode 308 is formed in the pixel portion. Furthermore, in the connection portion, an insulating layer 331 with an opening for partially or completely exposing the connection terminal 307 is formed. Herein, the first insulating layer 330 and the insulating layer 331 are shown as different insulating layers; however, they may be the same first insulating layer.

In the case of using a photosensitive material, light-exposure and development using a photomask are conducted, whereby the first insulating layer 330 with an opening on the first electrode 308 is formed. In any case, the first insulating layer 330 is formed so as to cover an end portion of the first electrode 308 and have an edge in a taper shape. By forming a tapered edge, coverage of a second insulating layer and an organic compound layer to be formed later can be made satisfactory.

Then, as described in Embodiment 10, the surface of the first electrode 308 is wiped with a polyvinyl alcohol (PVA) type porous material and a detergent, whereby the surface of the first electrode 308 is flattened and dust and the like are removed therefrom.

Thereafter, the resultant substrate is heated at 200° C. to 300° C., preferably 250° C., whereby moisture contained in the first insulating layer 310 is released. Because of this, a change in volume and dehydration of the first insulating layer can be prevented after the light-emitting element is completed. Thus, a light-emitting device can be provided in which initial degradation thereof does not occur and stability is ensured for a long period of time.

Thereafter, as described in Embodiment 10, a second insulating layer 332 is formed in the pixel portion. Regarding the subsequent processes, the manufacturing method described in Embodiment 10 can be referred to. Therefore, the description thereof will be omitted here.

The structure of the present embodiment can be implemented in combination with those of Embodiments 1 to 10.

Embodiment 12

In the present embodiment, mounting of an FPC to the connection portion described in Embodiments 10 and 11 will be described.

Figure 18A:
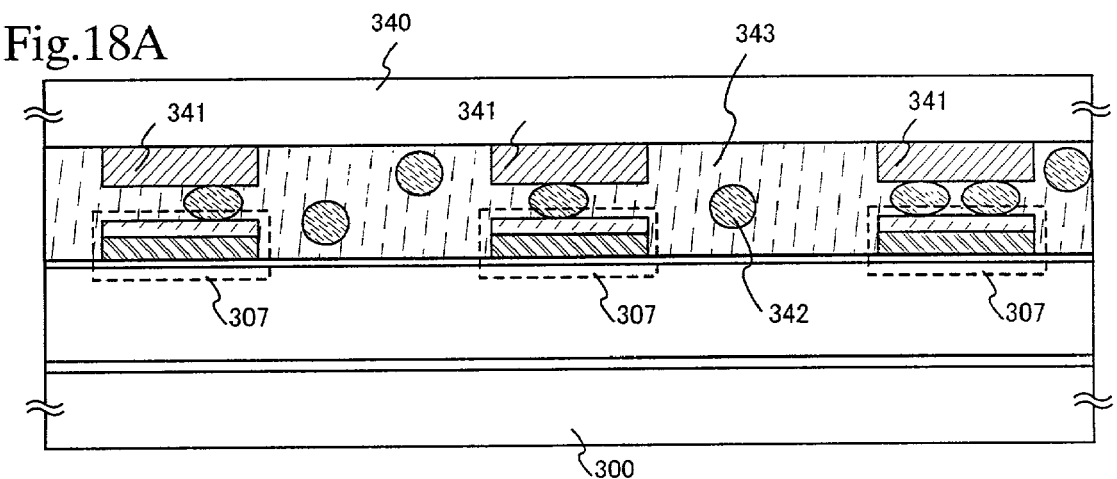
FIGS. 18A and 18B show a connection between a connection terminal of a light-emitting apparatus and a terminal of an FPC.

FIG. 18A shows a state where an FPC is mounted on a device substrate formed by the manufacturing method described in Embodiment 10. The FPC includes an FPC substrate 340 and a plurality of FPC wirings 341 formed on the FPC substrate 340. A mounting resin 343 containing a filler 342 is provided between the FPC substrate 340 and a device substrate 300. The FPC wirings 341 and the connection terminals 307 formed on the device substrate 300 are electrically connected to each other by the mounting resin 343 containing the filler 342.

Figure 18B:
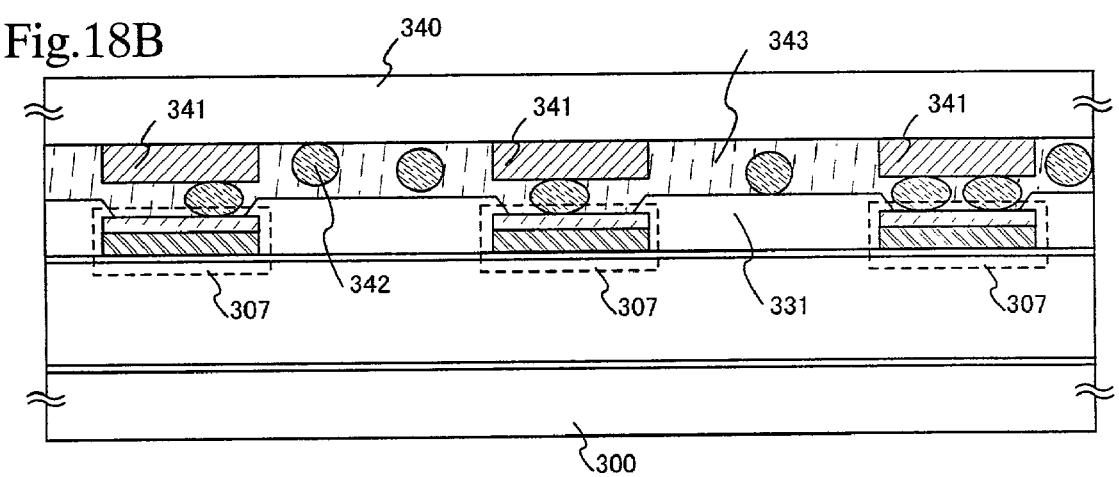

FIG. 18B shows a state where an FPC is mounted on a device substrate formed by the manufacturing method described in Embodiment 11. The FPC includes an FPC substrate 340 and a plurality of FPC wirings 341 formed on the FPC substrate 340. A mounting resin 343 containing a filler 342 is provided between the FPC substrate 340 and a device substrate 300. The FPC wirings 341 and the connection terminals 307 formed on the device substrate 300 are electrically connected to each other by the mounting resin 343 containing the filler 342.

The mounting resin 343 may be light-curable resin or thermosetting resin. Alternatively, the mounting resin 343 may be a mixture of light-curable resin and thermosetting resin. In the case of using a mixture of light-curable resin and thermosetting resin, the FPC wirings and the connection terminals are connected to each other provisionally by light, and connected with pressure by applying heat thereto. The filler 342 is required to be a conductive material. Two or more kinds of fillers with different sizes may be used.

The structure of the present embodiment can be implemented in combination with those of Embodiments 1 to 11.

Embodiment 13

In the present embodiment, a different method of manufacturing a light-emitting device of the present invention from that of Embodiment 1 will be described.

Figure 19A:
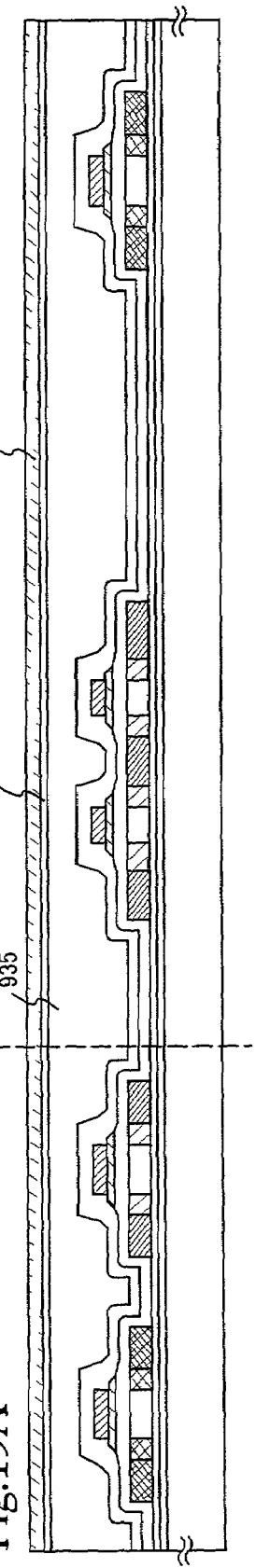
FIGS. 19A to 19C show an embodiment of the processes of manufacturing a light-emitting apparatus.

In the manufacturing processes described in Embodiment 1, a transparent conductive film 601 is formed to have a thickness of 80 to 120 nm on the insulating film 936 after the insulating film 936 is formed, as shown in FIG. 19A. In the present embodiment, an indium oxide (ITO) film or a film formed by mixing 2 to 20% zinc oxide (ZnO) with indium oxide is used as the transparent conductive film 601.

Then, the transparent conductive film 601 is polished by a so-called chemical-mechanical polishing (CMP). According to the CMP, the surface of a material to be polished is chemically or mechanically flattened on the basis of the surface to be polished. In general, a polishing cloth or a polishing pad (hereinafter, collectively referred to as a "pad") is attached to a platen or a polishing plate, and the platen or the polishing plate and a material to be polished are respectively rotated or shaken while a slurry is supplied between the material to be polished and the pad, whereby the surface of the material to be polished is polished by a chemical and mechanical function.

Any known slurry, pad, and CMP apparatus can be used for the CMP, provided that they can flatten the transparent conductive film 601. Any known polishing method can also be conducted. In the present embodiment, a slurry in which a polishing agent containing $Al_2O_3$ is dispersed in a solvent is used.

With the CMP polishing, the surface of the transparent conductive film 601 can be flattened, and an organic compound layer to be formed on the transparent conductive film 601 can be prevented from being deposited non-uniformly due to the unevenness of the transparent conductive film 601.

Next, the flattened transparent conductive film 601 is etched to form a first electrode 602 (FIG. 19A).

Thereafter, a resist mask with a predetermined pattern is formed, and contact holes reaching impurity regions to be source regions or drain regions formed in the respective semiconductor layers are formed. The contact holes are formed by dry etching. In this case, the insulating film 936 is first etched using a mixed gas of $CF_4$ and $O_2$ as an etching gas, and the second interlayer insulating film 935 of an organic resin material is etched using a mixed gas of $CF_4$, $O_2$, and He. Thereafter, the first interlayer insulating film 934 is etched, again using an etching gas of $CF_4$ and $O_2$. Furthermore, in order to enhance a selection ratio with respect to the semiconductor layers, the gate insulating film 906 is etched by changing the etching gas to $CHF_3$, whereby the contact holes can be formed.

Figure 19B:
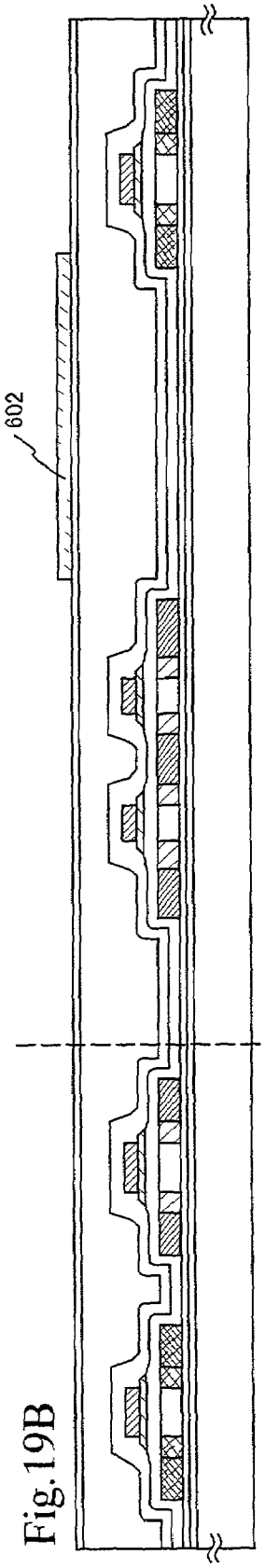

Then, a conductive metal film is formed by sputtering or vapor deposition and patterned with a mask followed by etching, whereby wirings 603 to 609 are formed. Although not shown, each of these wirings is formed of a laminate film of a Ti film (50 nm) and an alloy (Al and Ti) film (500 nm) in the present embodiment (FIG. 19B).

Figure 19C:
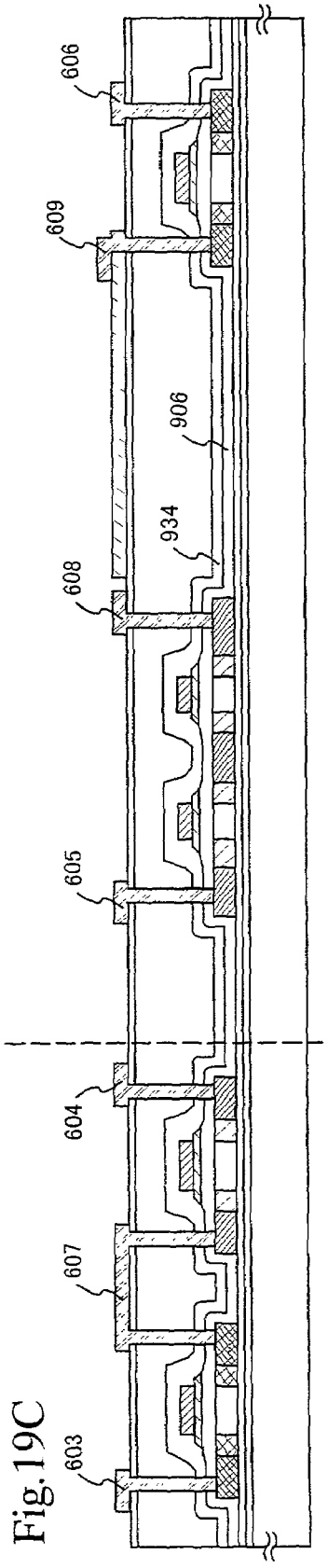

At this time, the drain wiring 609 is formed in contact with the first electrode 602. Accordingly, the first electrode 602 and the drain region of the current control TFT are electrically connected to each other (FIG. 19C). Herein, a heat treatment may be conducted to the first electrode 602 at 180° C. to 350° C.

Next, an insulating film of an organic resin material is formed on the first electrode 602. The subsequent processes are the same as those in Embodiment 1. Therefore, the description thereof will be omitted here.

The present embodiment can be implemented in combination with Embodiments 1 to 12.

Embodiment 14

In the present embodiment, an arrangement of a first insulating layer formed between pixels will be described.

Figure 20A:
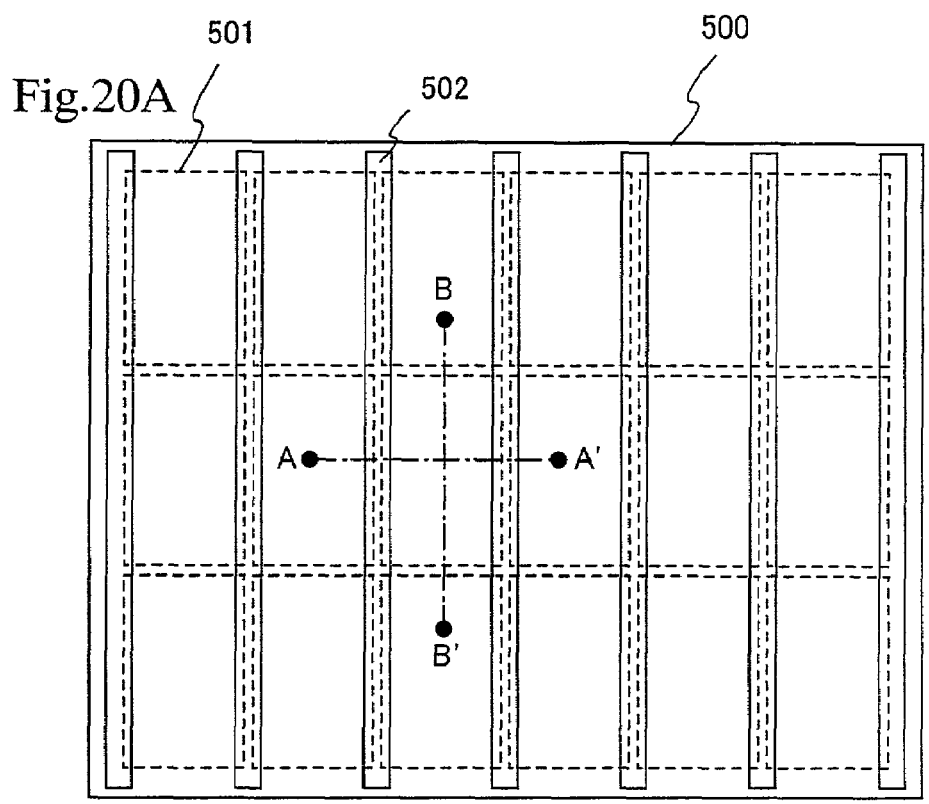
FIG. 20A is a top view of a pixel portion of a light-emitting apparatus.

FIG. 20A is a top view of a pixel portion of the present embodiment. A pixel portion 500 has a plurality of pixels 501. Reference numeral 502 denotes a first insulating layer, which covers portions between the pixels 501 and are formed in a stripe shape in the same direction as that of source wirings.

Figure 20B:
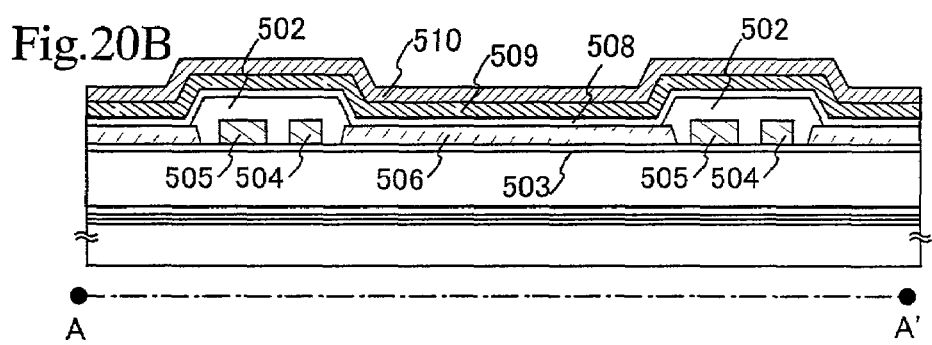
FIGS. 20B and 20C are cross-sectional views thereof.
Figure 20C:
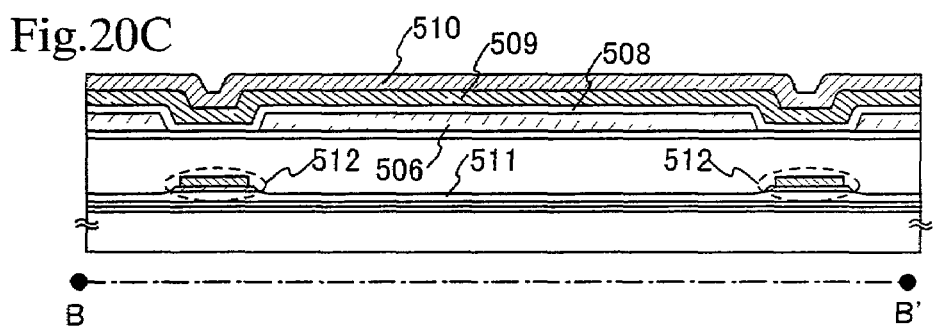

FIG. 20B is a cross-sectional view taken along the broken line A-A' of FIG. 20A. FIG. 20C is a cross-sectional view taken along the broken line B-B' of FIG. 20A. Gate wirings 512 are formed on a gate insulating film 511. Source wirings 504 and current supply lines 505 are formed on a second interlayer insulating film 503. Reference numeral 506 denotes first electrodes.

The first insulating layer 502 is formed so as to cover the source wirings 504 and the current supply lines 505. A second insulating layer 508 is formed so as to cover the first electrodes 506 and the first insulating layer 502. An organic compound layer 509 and a second electrode 510 are stacked on the second insulating layer 508.

The structure of the present embodiment can be implemented in combination with those of Embodiments 1 to 13.

Embodiment 15

In the present embodiment, a different arrangement of a first insulating layer formed between pixels from that of Embodiment 14, will be described.

Figure 21A:
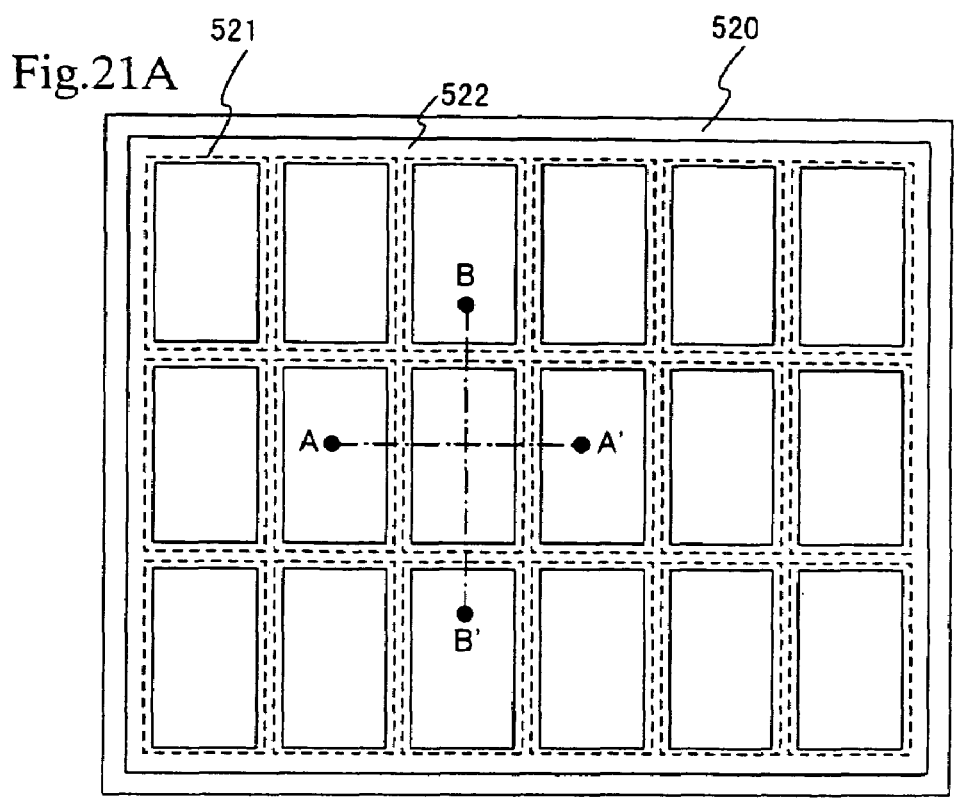
FIG. 21A is a top view of a pixel portion of a light-emitting apparatus.
Figure 21B:
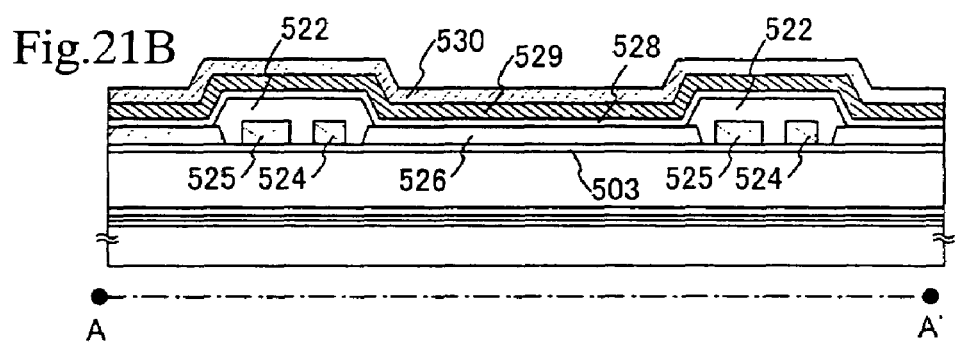
FIGS. 21B and 21C are cross-sectional views thereof.
Figure 21C:
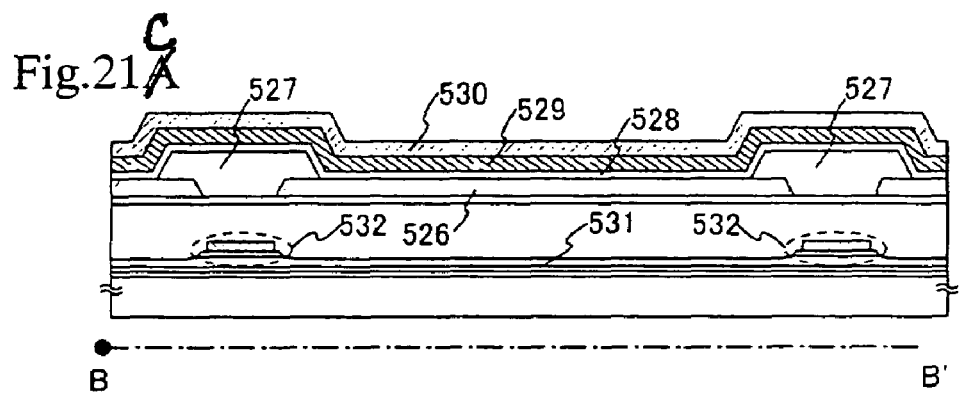

FIG. 21A is a top view of a pixel portion of the present embodiment. A pixel portion 520 has a plurality of pixels 521. Reference numeral 522 denotes a first insulating layer. The first insulating layer 522 covers portions between pixels 521 and are formed in a lattice shape. FIG. 21B is a cross-sectional view taken along the broken line A-A' of FIG. 21A. FIG. 21C is a cross-sectional view taken along the broken line B-B' of FIG. 21A.

Gate wirings 532 are formed on a gate insulating film 531. Source wirings 524 and current supply lines 525 are formed on a second interlayer insulating film 523. Reference numeral 526 denotes first electrodes.

The first insulating layer 522 is formed so as to cover the source wirings 524, the current supply lines 525, and the gate wirings 532. A second insulating layer 528 is formed so as to cover the first electrodes 526 and the first insulating layer 522. An organic compound layer 529 and a second electrode 530 are stacked on the second insulating layer 528.

The structure of the present embodiment can be implemented in combination with those of Embodiments 1 to 14.

Embodiment 16

Figure 22A:
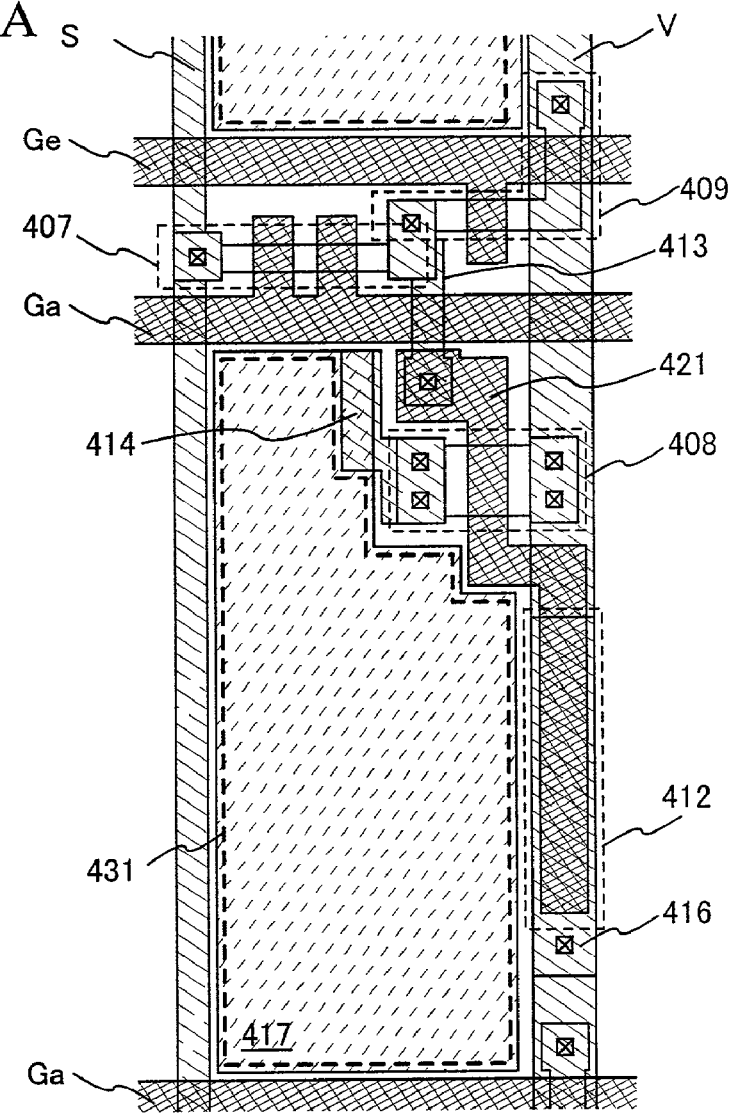
FIGS. 22A and 22B are top views of a pixel of a light-emitting apparatus.

In the present embodiment, a structure of a pixel of a light-emitting device according to the present invention will be described with reference to FIGS. 22A and 22B. FIG. 22A is a top view of a pixel, and FIG. 22B is a circuit diagram of a pixel.

Figure 22B:
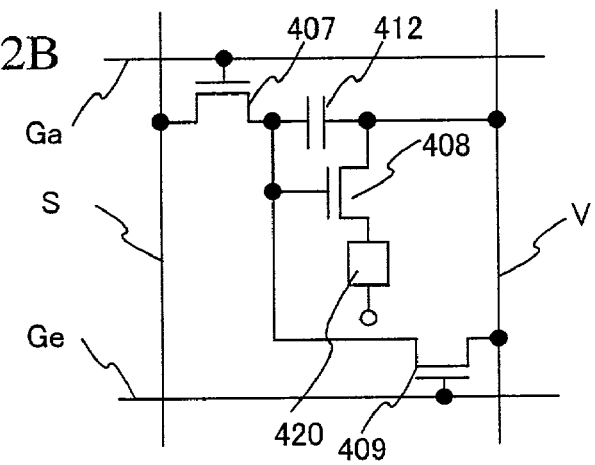

The pixel shown in FIGS. 22A and 22B has a source wiring (S), a current supply line (V), a gate wiring for writing (Ga), and a gate wiring for deletion (Ge). The pixel includes a switching TFT 407, a current control TFT 408, and a deletion TFT 409.

The switching TFT 407 has a part of the gate wiring for writing (Ga) as a gate electrode. One of the source region and the drain region of the switching TFT 407 is connected to the source wiring (S), and the other is connected to a connection wiring 421 via a connection wiring 413.

The current control TFT 408 has a part of the connection wiring 421 as a gate electrode. One of the source region and the drain region of the current control TFT 408 is connected to the current supply line (V), and the other is connected to a connection wiring 414. The connection wiring 414 is connected to the first electrode 417. The deletion TFT 409 has a part of the gate wiring for writing (Ge) as a gate electrode. One of the source region and the drain region of the deletion TFT 409 is connected to the current supply line (V), and the other is connected to the connection wiring 413.

A capacitance wiring 416 is formed of a semiconductor film. A capacitor 412 is formed by the capacitance wiring 416 electrically connected to the current supply line (V), an insulating film (not shown) that is the same as the gate insulating film, and the connection wiring 421. Furthermore, a capacitance formed by the connection wiring 421, a layer (not shown) that is the same as the first interlayer insulating film, and the current supply line (V) can be used as a capacitor.

A bank with an opening 431 provided by etching an organic resin film is formed on the first electrode 417. Although not shown, a second insulating film, an organic compound layer. and a second electrode are stacked on the first electrode 417 in this order. The first electrode 417 is in contact with the organic compound layer through the second insulating film in the opening 431 of the bank, and the organic compound layer emits light only in a portion interposed between the first electrode and the second electrode so as to be in contact therewith. A portion where the first electrode 417, the organic compound layer, and the second electrode are overlapped with each other corresponds to a light-emitting element 420.

The top view of the pixel portion of the light-emitting device according to the present invention is not limited to the structure shown in FIG. 22A. The switching TFT 407, the current control TFT 408, and the deletion TFT 409 may have a multi-gate structure such as a double-gate structure and a triple-gate structure, instead of a single-gate structure.

The structure of the present embodiment can be implemented in combination with those of Embodiments 1 to 15.

Embodiment 17

The light-emitting device using a light-emitting element is of the self-emission type, and thus exhibits more excellent recognizability of the displayed image in a light place as compared to the liquid crystal display device. Furthermore, the self-emission device has a wider viewing angle. Accordingly, the light-emitting device can be applied to a display portion in various electronic devices.

Such electronic devices using a light-emitting device of the present invention include a video camera, a digital camera, a goggles type display (head mount display), a navigation system, a sound reproduction device (a car audio equipment and an audio set), a lap-top computer, a game machine, a portable information terminal (a mobile computer, a portable telephone (cellular phone), a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 11A to 11H respectively show various specific examples of such electronic devices.

Figure 11A:
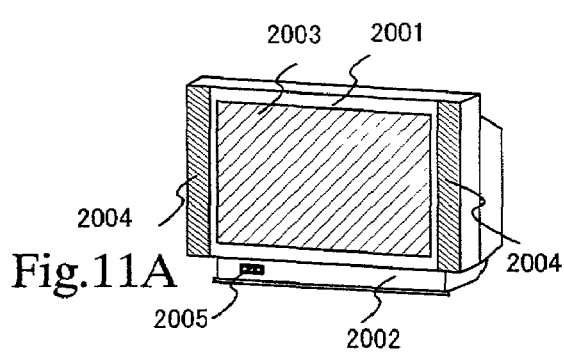
FIGS. 11A to 11H show examples of electric equipment.

FIG. 11A illustrates a display device which includes a frame 2001, a support table 2002, a display portion 2003, a speaker portion 2004, a video input terminal 2005 or the like. The present invention is applicable to the display portion 2003. The light-emitting device is of the self-emission type and therefore requires no back-light. Thus, the display portion thereof can have a thickness thinner than that of the liquid crystal display device. The display device is including all of the display device for displaying information, such as a personal computer, a receiver of TV broadcasting and an advertising display. Even if the screen size is assumed to be 30 inches when using it for the TV broadcasting, the light-emitting device of the present invention can be applied.

Figure 11B:
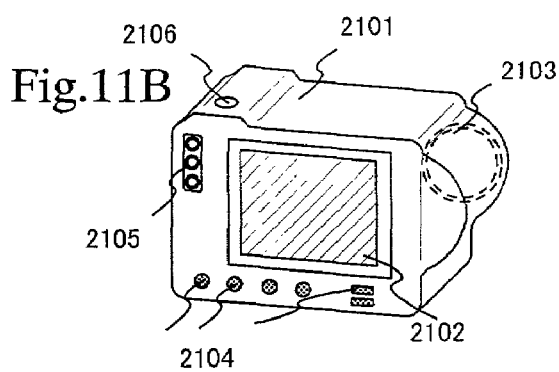

FIG. 11B illustrated a digital still camera which includes a main body 2101, a display portion 2102, an image receiving portion 2103, an operation key 2104, an external connection port 2105, a shutter 2106, or the like. The light-emitting device in accordance with the present invention can be used as the display portion 2102.

Figure 11C:
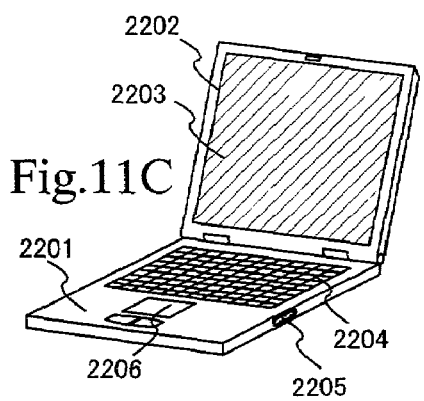

FIG. 11C illustrates a lap-top computer which includes a main body 2201, a casing 2202, a display portion 2203, a keyboard 2204, an external connection port 2205, a pointing mouse 2206, or the like. The light-emitting device in accordance with the present invention can be used as the display portion 2203.

Figure 11D:
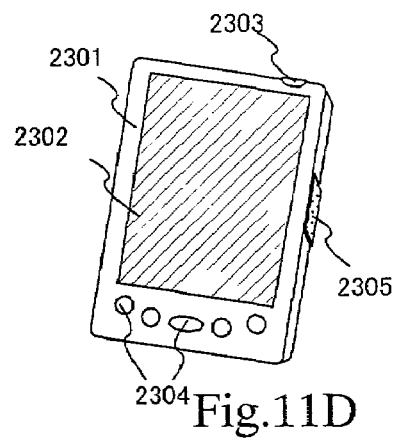

FIG. 11D illustrated a mobile computer which includes a main body 2301, a display portion 2302, a switch 2303, an operation key 2304, an infrared port 2305, or the like. The light-emitting device in accordance with the present invention can be used as the display portion 2302.

Figure 11E:
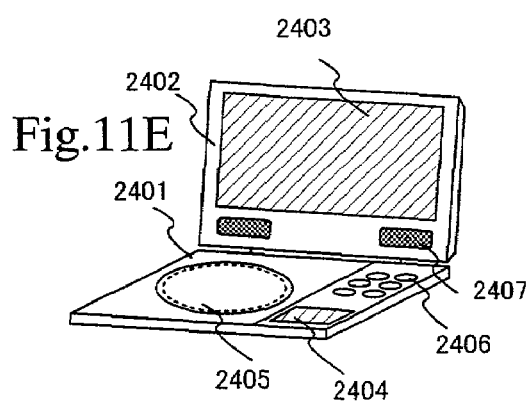

FIG. 11E illustrates a portable type image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device in accordance with the present invention can be used as these display portions A 2403 and B 2404. The image reproduction apparatus including a recording medium further includes a game machine or the like.

Figure 11F:
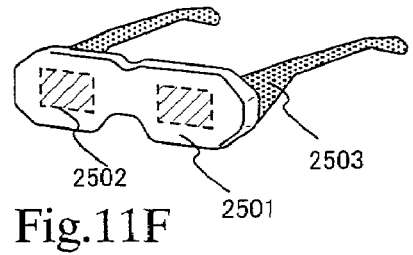

FIG. 11F illustrates a goggle type display (head mounted display) which includes a main body 2501, a display portion 2502, an arm portion 2503. The light-emitting device in accordance with the present invention can be used as the display portion 2502.

Figure 11G:
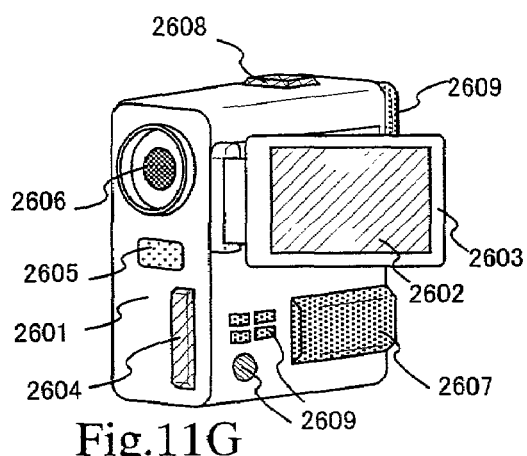

FIG. 11G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light-emitting device in accordance with the present invention can be used as the display portion 2602.

Figure 11H:
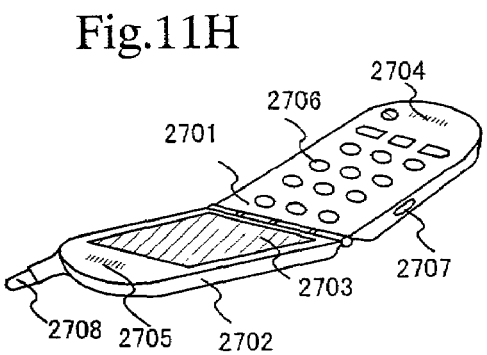

FIG. 11H illustrates a mobile phone (cellular phone) which includes a main body 2701, a casing 2702, a display portion 2703, a sound input portion 2704, a sound output portion 2705, an operation key 2706, an external connecting port 2707, an antenna 2708, or the like. The light-emitting device in accordance with the present invention can be used as the display portion 2703. Note that the display portion 2703 can reduce power consumption of the portable telephone by displaying white colored characters on a black colored background.

When the brighter luminance of the organic materials becomes available in the future, the light-emitting device in accordance with the present invention will be applicable to a front type or rear type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic material can exhibit high response speed.

A portion of the light-emitting device that is emitting light consumes power, so it is desirable to display information in such a manner that the light-emitting portion therein becomes as small as possible. Accordingly, when the self-emission device is applied to a display portion which mainly displays character information, e.g., a display portion of a portable information terminal, and more particular, a mobile phone or a sound reproduction device, it is desirable to drive the light-emitting device so that the character information is formed by a light-emitting portion while a non emission portion corresponds to the background.

As set forth above, the present invention can be applied variously to a wide range of electronic devices in all fields. The electronic device in the present embodiment can be obtained by utilizing a light-emitting device having the configuration in which the structures in Embodiments 1 to 16 are freely combined.

As described above, according to the present invention, a second insulating layer which allows a tunnel current to flow therethrough is provided to a thickness of about 1 to 10 nm (preferably, about 2 to 3 nm) on a first electrode (anode) and a first insulating layer. In the result, minute unevenness on the surface of the first electrode (anode) can be flattened, and an organic compound layer can be formed uniformly. Furthermore, even if unevenness and foreign matters with tens of to hundreds of nm are present on the first interlayer insulating film 104 or the second interlayer insulating film 105, a dark spot and a defect (non-lighting of a light-emitting element due to a short-circuit between the first and second electrodes) can be prevented by forming a second insulating layer.

Furthermore, by providing the second insulating layer 112, degassing from a first insulating layer 109 formed of an organic resin material such as polyimide, polyamide, and acrylic resin can be prevented, and an organic compound layer 113 can be prevented from being degraded. Still furthermore, Li and Mg that are elements constituting a second electrode 114 can be prevented from diffusing to a current control TFT side.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting device comprising:
a first electrode formed on an insulating surface;
a first insulating layer covering an end portion of the first electrode and comprising a tapered edge;
a second insulating laser formed on the first electrode and the first insulating layer;
an organic compound layer formed on the second insulating layer; and
a second electrode formed on the organic compound layer, wherein the first electrode is not in direct contact with the organic compound layer.

2. A light-emitting device according to claim 1, wherein the second insulating layer comprises at least one selected from the group consisting of silicon oxide, silicon nitride, and silicon oxynitride.

3. A light-emitting device according to claim 1, wherein the second insulating layer comprises carbon as a main component thereof.

4. A light-emitting device according claim 1, wherein the insulating surface comprises at least one of silicon nitride and silicon oxynitride.

5. A light-emitting device according to claim 1, wherein the first insulating layer comprises at least one of polyimide arid acrylic resin.

6. A light-emitting device according to claim 1, wherein the second insulating layer has a thickness of 1 to 10 nm.

7. A light-emitting device according to claim 1, wherein the insulating surface comprises at least one of polyimide resin and acrylic resin.

8. A light-emitting device according to claim 1, wherein the light-emitting device is incorporated in one selected from the group consisting of a computer, a digital camera, a video camera, and a mobile phone.

9. A light-emitting device according to claim 1, wherein the first electrode and the organic compound layer are connected to each other through a tunnel junction.

10. A light-emitting device according to claim 1, wherein the second insulating layer has a thickness that allows the first electrode and the organic compound layer to form a tunnel junction.

11. A light-emitting device according to claim 1, wherein the second insulating layer has a thickness that allows a tunnel current or a Fowler-Nordheim current to flow therethrough.

12. A light-emitting device comprising:
a thin film transistor comprising a source region and a drain region;
an interlayer insulating film over the source region and the drain region;
a drain electrode connected to the drain region through an opening formed in the interlayer insulating film;
a first electrode formed on the interlayer insulating film so as to be connected to the drain electrode;
a first insulating layer comprising an opening on the first electrode, covering an end portion of the first electrode, and comprising a tapered edge;
a second insulating layer formed on the first electrode and the first insulating layer;
an organic compound layer formed on the second insulating layer; and
a second electrode formed on the organic compound layer, wherein the first electrode is not in direct contact with the organic compound layer.

13. A light-emitting device according to claim 12, wherein the second insulating layer comprises at least one selected from the group consisting of silicon oxide, silicon nitride, and silicon oxynitride.

14. A light-emitting device according to claim 12, wherein the second insulating layer comprises carbon as a main component thereof.

15. A light-emitting device according to claim 12, wherein the interlayer insulating film comprises at least one of silicon nitride and silicon oxynitride.

16. A light-emitting device according to claim 12, wherein the interlayer insulating film comprises a first layer comprising at least one of polyimide and acrylic resin and a second layer comprising at least one of silicon nitride, silicon oxynitride, carbon, and a densified film of the first layer.

17. A light-emitting device according to claim 12, wherein the first insulating layer comprises at least one of polyimide and acrylic resin.

18. A light-emitting device according to claim 12, wherein the second insulating layer has a thickness of 1 to 10 nm.

19. A light-emitting device according to claim 12, wherein the interlayer insulating film comprises at least one of polyimide resin and acrylic resin.

20. A light-emitting device according to claim 12, wherein the light-emitting device is incorporated in one selected from the group consisting of a computer, a digital camera, a video camera, and a mobile phone.

21. A light-emitting device according to claim 12, wherein the first electrode and the organic compound layer are connected to each other through a tunnel junction.

22. A light-emitting device according to claim 12, wherein the second insulating layer has a thickness that allows the first electrode and the organic compound layer to form a tunnel junction.

23. A light-emitting device according to claim 12, wherein the second insulating layer has a thickness that allows a tunnel current or a Fowler-Nordheim current to flow therethrough.

24. A method of manufacturing a light-emitting apparatus, comprising the steps of:
forming a first electrode on an insulating surface;
forming a first insulating layer covering an end portion of the fist electrode and comprising a tapered edge;

forming a second insulating layer on the first electrode and the first insulating layer;

forming an organic compound layer on the second insulating layer; and forming a second electrode on the organic compound layer, wherein the first electrode and the organic compound layer are connected to each other through a tunnel junction.

25. A method of manufacturing a light-emitting device according to claim 24, wherein the second insulating layer comprises at least one selected from the group consisting of silicon oxide, silicon nitride, and silicon oxynitride.

26. A method of manufacturing a light-emitting device according to claim 24, wherein the second insulating layer comprises carbon as a main component thereof.

27. A method of manufacturing a light-emitting device according to claim 24, wherein the first insulating layer comprises at least one of polyimide and acrylic resin, and a surface of the first insulating layer is modified by plasma treatment.

28. A method of manufacturing a light-emitting device according to claim 24, wherein the second insulating layer has a thickness of 1 to 10 nm.

29. A method of manufacturing a light-emitting apparatus, comprising the steps of:

forming a first electrode on an insulating surface;

forming a first insulating layer covering an end portion of the first electrode and comprising a tapered edge;

forming a second insulating layer on the first electrode and the first insulating layer;

forming a organic compound layer on the second insulating layer; and forming a second electrode on the organic compound layer, wherein the second insulating layer has a thickness that allows the first electrode and the organic compound layer to form a tunnel junction.

30. A method of manufacturing a light-emitting device according to claim 29, wherein the second insulating layer comprises at least one selected from the group consisting of silicon oxide, silicon nitride, and silicon oxynitride.

31. A method of manufacturing a light-emitting device according to claim 29, wherein the second insulating layer comprises carbon as a main component thereof.

32. A method of manufacturing a light-emitting device according to claim 29, wherein the first insulating layer comprises at least one of polyimide and acrylic resin, and a surface of the first insulating layer is modified by plasma treatment.

33. A method of manufacturing a light-emitting device according to claim 29, wherein the second insulating layer has a thickness of 1 to 10 nm.

34. A method of manufacturing a light-emitting apparatus, comprising the steps of:

forming a first electrode on an insulating surface;

forming a first insulating layer covering an end portion of the first electrode and comprising a tapered edge;

forming a second insulating layer on the first electrode and the first insulating layer;

forming an organic compound layer on the second insulating layer; and forming a second electrode on the organic compound layer, wherein the second insulating layer has a thickness that allows the tunnel current or the Fowler-Nordheim current to flow therethrough.

35. A method of manufacturing a light-emitting device according to claim 34, wherein the second insulating layer comprises at least one selected from the group consisting of silicon oxide, silicon nitride, and silicon oxynitride.

36. A method of manufacturing a light-emitting device according to claim 34, wherein the second insulating layer comprises carbon as a main component thereof.

37. A method of manufacturing a light-emitting device according to claim 34, wherein the first insulating layer comprises at least one of polyimide and acrylic resin, and a surface of the first insulating layer is modified by plasma treatment.

38. A method of manufacturing a light-emitting device according to claim 34, wherein the second insulating layer has a thickness of 1 to 10 nm.

39. A method of manufacturing a light-emitting device, comprising the steps of:

forming an interlayer insulating film over a source region and a drain region of a thin film transistor;

forming an opening reaching the drain region in the interlayer insulating film;

forming a drain electrode;

forming a first electrode connected to the drain electrode on the interlayer insulating film;

forming an insulating layer that covers the first electrode connected to the drain electrode;

forming an opening in the insulating layer on the first electrode to provide a first insulating layer;

forming a second insulating layer on the first electrode and the first insulating layer;

forming an organic compound layer on the second insulating layer; and forming a second electrode on the organic compound layer, wherein the first electrode and the organic compound layer are connected to each other through a tunnel junction.

40. A method of manufacturing light-emitting device according to claim 39, wherein the second insulating layer comprises at least one selected from the group consisting of silicon oxide, silicon nitride, and silicon oxynitride.

41. A method of manufacturing a light-emitting device according to claim 39, wherein the second insulating layer comprises carbon as a main component thereof.

42. A method of manufacturing a light-emitting device according to claim 39, wherein the interlayer insulating film comprises at least one of polyimide and acrylic resin.

43. A method of manufacturing a light-emitting device according to claim 39, wherein the interlayer insulating film comprises a first layer comprising at least one of polyimide and acrylic resin and a second layer comprising at least one of silicon nitride, silicon oxynitride, carbon, and a densified film of the first layer.

44. A method of manufacturing a light-emitting device according to claim 39, wherein the first insulating layer comprises at least one of polyimide and acrylic resin, and a surface of the first insulating layer is modified by plasma treatment.

45. A method of manufacturing a light-emitting device according to claim 39, wherein the second insulating layer has a thickness of 1 to 10 nm.

46. A method of manufacturing a light-emitting device, comprising the steps of:

forming an interlayer insulating film over a source region and a drain region of a thin film transistor:

forming an opening reaching the drain region in the interlayer insulating film;

forming a drain electrode;
forming a first electrode connected to the drain electrode on the interlayer insulating film;
forming an insulating layer that covers the first electrode connected to the drain electrode;
forming an opening in the insulating layer on the first electrode to provide a first insulating layer;
forming a second insulating layer on the first electrode and the first insulating layer;
forming an organic compound layer on the second insulating layer; and
forming a second electrode on the organic compound layer,
wherein the second insulating layer has a thickness that allows the first electrode and the organic compound layer to form a tunnel junction.

47. A method of manufacturing a light-emitting device according to claim 46, wherein the second insulating layer comprises at least one selected from the group consisting of silicon oxide, silicon nitride, and silicon oxynitride.

48. A method of manufacturing a light-emitting device according to claim 46, wherein the second insulating layer comprises carbon as a main component thereof.

49. A method of manufacturing a light-emitting device according to claim 46, wherein the interlayer insulating film comprises at least one of polyimide and acrylic resin.

50. A method of manufacturing a light-emitting device according to claim 46, wherein the interlayer insulating film comprises a first layer comprising at least one of polyimide and acrylic resin and a second layer comprising at least one of silicon nitride, silicon oxynitride, carbon, and a densified film of the first layer.

51. A method of manufacturing a light-emitting device according to claim 46, wherein the first insulating layer comprises at least one of polyimide and acrylic resin, and a surface of the first insulating layer is modified by plasma treatment.

52. A method of manufacturing a light-emitting device according to claim 46, wherein the second insulating layer has a thickness 1 to 10 nm.

53. A method of manufacturing a light-emitting device, comprising the steps of:
forming an interlayer insulating film over a source region and a drain region of a thin film transistor;
forming an opening reaching the drain region in the interlayer insulating film;
forming a drain electrode;
forming a first electrode connected to the drain electrode on the interlayer insulating film;
forming an insulating layer that covers the first electrode connected to the drain electrode;
forming an opening in the insulating layer on the first electrode to provide a first insulating layer;
forming a second insulating layer on the first electrode and the first insulating layer;
forming an organic compound layer on the second insulating layer; and
forming a second electrode on the organic compound layer,
wherein the second insulating layer has a thickness that allows the tunnel current or the Fowler-Nordheim current to flow therethrough.

54. A method of manufacturing a light-emitting device according to claim 53, wherein the second insulating layer comprises at least one selected from the group consisting of silicon oxide, silicon nitride, and silicon oxynitride.

55. A method of manufacturing a light-emitting device according to claim 53, wherein the second insulating layer comprises carbon as a main component thereof.

56. A method of manufacturing a light-emitting device according to claim 53, wherein the interlayer insulating film comprises at least one of polyimide and acrylic resin.

57. A method of manufacturing a light-emitting device according to claim 53, wherein the interlayer insulating film comprises a first layer comprising at least one of polyimide and acrylic resin and a second layer comprising at least one of silicon nitride, silicon oxynitride, carbon, and a densified film of the first layer.

58. A method of manufacturing a light-emitting device according to claim 53, wherein the first insulating layer comprises at least one of polyimide and acrylic resin, and a surface of the first insulating layer is modified by plasma treatment.

59. A method of manufacturing a light-emitting device according to claim 53, wherein the second insulating layer has a thickness of 1 to 10 nm.

60. A light-emitting device comprising:
a first electrode formed on an insulating surface;
a first insulating layer covering an end portion of the first electrode and comprising a tapered edge;
a layer comprising carbon formed on the first electrode and the first insulating layer;
an organic compound layer formed on the layer comprising carbon; and
a second electrode formed on the organic compound layer,
wherein the first electrode is not in direct contact with the organic compound layer.

61. A light-emitting device according to claim 60, wherein the layer comprising carbon comprises diamond-like carbon.

62. A light-emitting device according to claim 60, wherein the insulating surface comprises at least one of silicon nitride and silicon oxynitride.

63. A light-emitting device according to claim 60, wherein the insulating surface comprises a first layer comprising at least one of polyimide and acrylic resin and a second layer comprising at least one of silicon nitride, silicon oxynitride, carbon, and a densified film of the first layer.

64. A light-emitting device according to claim 60, wherein the first insulating layer comprises at least one of polyimide and acrylic resin.

65. A light-emitting device according to claim 60, wherein the layer comprising carbon has a thickness of 1 to 10 nm.

66. A light-emitting device according to claim 60, wherein the insulating surface comprises at least one of polyimide resin and acrylic resin.

67. A light-emitting device according to claim 60, wherein the light-emitting device is incorporated in one selected from the group consisting of a computer, a digital camera, a video camera, and a mobile phone.

68. A light-emitting device according to claim 60, further comprising a thin film transistor comprising:
a source region and a drain region; and
a drain electrode connected to the drain region through an opening formed in the insulating surface,
wherein the first electrode is connected to the drain electrode.

* * * * *